(12) United States Patent
Wang et al.

(10) Patent No.: US 11,335,863 B2
(45) Date of Patent: May 17, 2022

(54) COMPOUND, DISPLAY PANEL AND DISPLAY APPARATUS

(71) Applicant: WuHan TianMa Micro-electronics CO., LTD, Wuhan (CN)

(72) Inventors: Kun Wang, Wuhan (CN); Kui Wang, Wuhan (CN); Longxin Pan, Wuhan (CN); Xin Ke, Wuhan (CN); Tiansheng Ye, Wuhan (CN)

(73) Assignee: WUHAN TIANMA MICRO-ELECTRONICS CO., LTD, Wuhan (CN)

( * ) Notice: Subject to any disclaimer, the term of this patent is extended or adjusted under 35 U.S.C. 154(b) by 309 days.

(21) Appl. No.: 16/588,909

(22) Filed: Sep. 30, 2019

(65) Prior Publication Data
US 2020/0381625 A1    Dec. 3, 2020

(30) Foreign Application Priority Data
May 30, 2019 (CN) .......................... 201910460184.2

(51) Int. Cl.
*H01L 51/00* (2006.01)
*C07F 5/02* (2006.01)
*C09K 11/06* (2006.01)
*H01L 51/50* (2006.01)

(52) U.S. Cl.
CPC ............ *H01L 51/008* (2013.01); *C07F 5/027* (2013.01); *C09K 11/06* (2013.01); *C09K 2211/1018* (2013.01); *H01L 51/5012* (2013.01); *H01L 2251/552* (2013.01)

(58) Field of Classification Search
CPC ............ H01L 51/0071; H01L 51/0056; H01L 51/0052; H01L 51/008; C09K 11/06; C09K 2211/1018; C07F 5/027
See application file for complete search history.

(56) References Cited

U.S. PATENT DOCUMENTS

2009/0261717 A1* 10/2009 Buesing .............. C07D 493/06
313/504
2020/0235306 A1* 7/2020 Yen ..................... H01L 51/0073

* cited by examiner

*Primary Examiner* — Alexander C Kollias
(74) *Attorney, Agent, or Firm* — Christensen O'Connor Johnson Kindness PLLC

(57) ABSTRACT

A compound, having a structure represented by Formula (I),

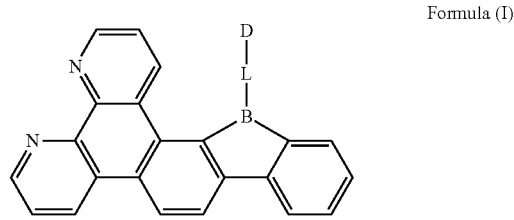

Formula (I)

in which L is selected from the group consisting of a substituted or unsubstituted phenyl, a substituted or unsubstituted naphthyl, a substituted or unsubstituted pyridyl, a substituted or unsubstituted pyrimidinyl, and a substituted or unsubstituted pyrazinyl; and D is an electron donor and is selected from the group consisting of a substituted or unsubstituted phenyl, biphenyl, naphthyl, anthryl, phenanthryl, acenaphthylenyl, pyrenyl, perylenyl, fluorenyl, spirobifluorenyl, chrysenyl, benzophenanthrenyl, benzanthracenyl, fluoranthenyl, picenyl, furyl, benzofuryl, dibenzofuryl, thienyl, benzothienyl, dibenzothiophenyl, phenoxazinyl, phenazinyl, phenothiazinyl, thianthrenyl, carbazolyl, acridinyl, and diarylamino. The compound according to the present disclosure has the TADF property, and the triplet excitons, which are blocked in molecular transition of the conventional fluorescent material, can be used to emit light, thereby improving the efficiency of device.

17 Claims, 3 Drawing Sheets

COMPOUND, DISPLAY PANEL AND DISPLAY APPARATUS

CROSS-REFERENCE TO RELATED APPLICATIONS

The present application claims priority to Chinese Patent Application No. 201910460184.2, filed on May 30, 2019, the content of which is incorporated herein by reference in its entirety.

TECHNICAL FIELD

The present disclosure relates to the technical field of organic electroluminescent materials, and particularly, to a compound, a display panel including the compound and a display apparatus.

BACKGROUND

According to categories of luminescent excitons, the organic electroluminescent devices (OLEDs) can be classified into fluorescent devices and phosphorescent devices. Compared with the conventional fluorescent devices that emit light only by using singlet exciton energy (25%), the phosphorescent devices have broader application prospects because they can theoretically achieve 100% of internal quantum efficiency. However, the phosphorescent devices are expensive due to their high content of heavy metals (almost several times that of the fluorescent material) and also have poor stability (i.e., short service time).

In recent years, a new light-emitting material, i.e., thermally activated delayed fluorescence (TADF) material, has been studied. Upon the principle of E-type up conversion, the energy of singlet and triplet excitons can be utilized simultaneously, and the higher internal quantum efficiency can be achieved. Since such TADF materials and conventional fluorescent materials do not contain heavy metals, their cost can be greatly reduced and the stability can be improved. At present, the devices based on these materials already have a comparable external quantum efficiency (EQE) as the phosphorescent devices.

If the delayed fluorescence needs to utilize a reverse intersystem crossing (RISC) from the triplet to singlet state energy level to emit light, an energy difference between the singlet energy level and triplet energy level is required to be reduced to a certain value (generally, $\Delta E_{ST} \leq 0.2$ ev) to satisfy a required RISC. $\Delta E_{ST}$ and the overlap degree between HOMO and LUMO satisfy the following relationship:

$$\Delta E_{ST} = E(S) - E(T) = 2J(\phi, \phi^*)$$

$$J(\phi, \phi^*) = \left\langle \phi(1)\phi^*(2) \left| \frac{e^2}{r_{1,2}} \right| \phi(2)\phi^*(1) \right\rangle.$$

That is, $\Delta E_{ST}$ is positively correlated with the overlap degree between HOMO and LUMO. In order to reduce $\Delta E_{ST}$, it is necessary to separate HOMO from LUMO as much as possible.

At present, the main factors that restrict the development of stable and efficient blue light-emitting materials are as follows:

(1) Emitting blue light requires a bandwidth of 3.0 eV, which limits the conjugation length of an aromatic compound, i.e., the molecule cannot have a large conjugation structure, and the molecular size of the light-emitting material cannot be excessively large. However, the small molecular structure may lead to a low thermal stability of the light-emitting material.

(2) Large molecular rigid structure is necessary for obtaining high-efficient blue light. However, an excessively great rigidity of the molecular structure may increase the difficulty in obtaining phase-stable thin film materials; and (3) The wide energy band significantly hampers the simultaneous injection of electrons and holes, breaking the balance between electrons and holes and resulting in a decrease in luminous efficiency.

The introduction of the triphenylamine structure allows the compound to form a twisted structure similar to a propeller structure, which avoids the occurrence of intermolecular agglomeration, and the photoluminescence wavelength is 436 nm in the range of deep blue light. Since the triphenylamine structure is an electron donor, the turn-on voltage of the device can be lowered. The OLED device made of such a compound requires a lower turn-on voltage (3.7 eV), and has a maximum luminance of 13306.5 cd/m², a quantum efficiency of 0.816%, a light-emitting efficiency of 2.156 cd/A$^{-1}$ and a luminous efficiency of 1.4641 1 m/W$^{-1}$.

The compound represented by the following Formula (1) has the propeller structure and can well avoid quantum quenching due to agglomeration. However, this compound, due to its large free volume, will cause a decrease in its glass transition temperature, which in turn leads to unsatisfying thermal stability.

Formula (1)

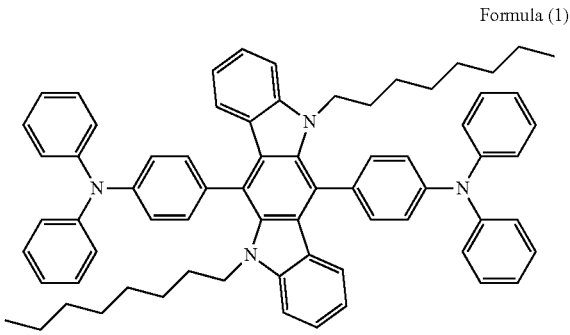 [SMILES: CCCCCCCCn1c2ccccc2c2c(-c3ccc(N(c4ccccc4)c4ccccc4)cc3)c3c(c(-c4ccc(N(c5ccccc5)c5ccccc5)cc4)c21)c1ccccc1n3CCCCCCCC]

SUMMARY

In view of the problems in the related art, a first aspect of the present disclosure provides a compound having a structure represented by Formula (I):

Formula (I)

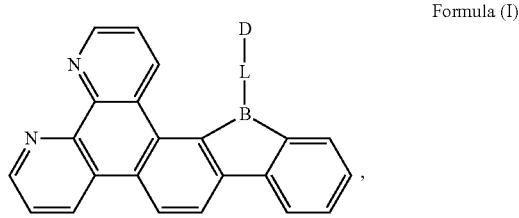

wherein

L is selected from the group consisting of a substituted or unsubstituted phenyl, a substituted or unsubstituted naphthyl, a substituted or unsubstituted pyridyl, a substituted or unsubstituted pyrimidinyl, and a substituted or unsubstituted pyrazinyl; and D is an electron donor, and is selected from the group consisting of a substituted or unsubstituted phenyl, a substituted or unsubstituted biphenyl, a substituted or unsubstituted naphthyl, a substituted or unsubstituted anthryl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted benzophenanthrenyl, a substituted or unsubstituted benzanthracenyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, a substituted or unsubstituted carbazolyl, a substituted or unsubstituted acridinyl, and a substituted or unsubstituted diarylamino.

A second aspect of the present disclosure provides a display panel including an anode, a cathode, and a light-emitting layer disposed between the anode and the cathode. The light-emitting material of the light-emitting layer includes one or more of compounds according to the first aspect of the present disclosure.

A third aspect of the present disclosure also provides a display apparatus including the display panel of the present disclosure.

DESCRIPTION OF EMBODIMENTS

The present disclosure is further described in the following examples and comparative examples, which are merely intended to illustrate the invention, but not to limit the present disclosure. Any modifications or equivalent substitutions of the technical solutions according to the present disclosure shall fall within the protection scope of the present disclosure.

Figure 1:
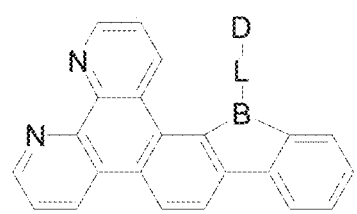
FIG. 1 is a general chemical formula of a borocarbazole compound according to the present disclosure.

The first aspect of the present disclosure provides a compound, having a structure represented by Formula (I) as shown in FIG. 1:

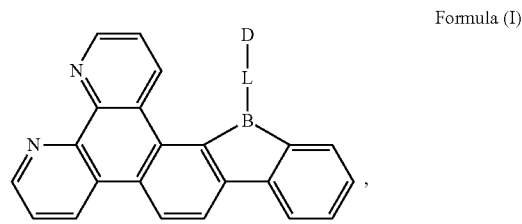

Formula (I)

wherein

L is selected from the group consisting of a substituted or unsubstituted phenyl, a substituted or unsubstituted naphthyl, a substituted or unsubstituted pyridyl, a substituted or unsubstituted pyrimidinyl, and a substituted or unsubstituted pyrazinyl; and D is an electron donor, and is selected from the group consisting of a substituted or unsubstituted phenyl, a substituted or unsubstituted biphenyl, a substituted or unsubstituted naphthyl, a substituted or unsubstituted anthryl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted benzophenanthrenyl, a substituted or unsubstituted benzanthracenyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, a substituted or unsubstituted carbazolyl, a substituted or unsubstituted acridinyl, and a substituted or unsubstituted diarylamino.

According to the present disclosure, in the OLED material of borocarbazole-phenanthroline, for example, spirobifluorenyl is used as a P-type chromophore (electron donor) of a molecule, and is connected to an electron acceptor unit through a linker sp3-hybridized group of borocarbazole. By incorporating the phenanthroline group, the stability of the material can be enhanced, the service time of the device is prolonged, and by shortening the conjugation length, increasing the energy level, the charge transfer in the molecule is reduced, and the luminescence spectrum is narrowed.

Since the compound according to the disclosure has the TADF property, the triplet excitons, which are blocked in molecular transition of the conventional fluorescent material, can be used to emit light, thereby improving the efficiency of device. Without wishing to be bound by theory, it is believed that the fundamental reason is due at least in part to the fact that the designed molecules have a great rigidity distortion, which reduces the overlap between HOMO and LUMO. In this way, an energy difference between the triplet state and the singlet state can be reduced to about 0.1 eV, which satisfies reverse intersystem crossing of the triplet state to the singlet state, thereby improving the light-emitting efficiency.

According to an embodiment of the present disclosure, D is according to any one of the following formulas:

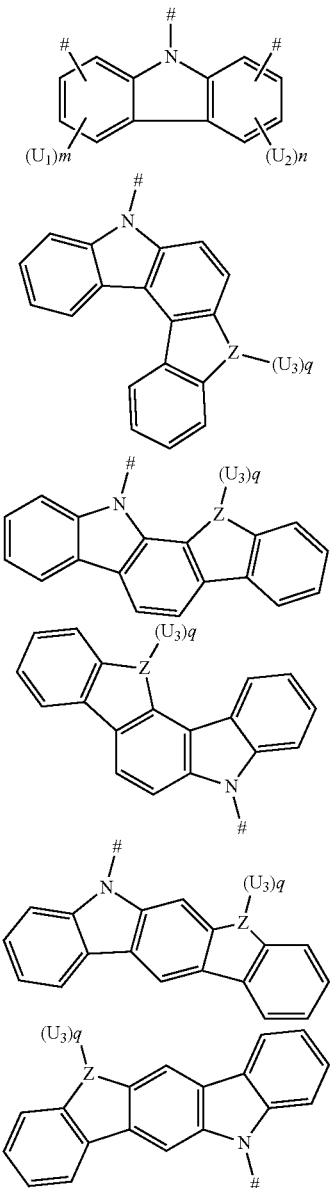

wherein,
Z is selected from the group consisting of a carbon atom, a nitrogen atom, an oxygen atom and a sulfur atom;
$U_1$, $U_2$ and $U_3$ are each independently selected from the group consisting of a hydrogen atom, C1-C6 alkyl, and C1-C6 alkoxy;
q is an integer chosen from 0, 1 and 2;
when Z is an oxygen atom or a sulfur atom, q is 0; and
indicates a bonding position.

In this embodiment, the carbazole substituent contained in the compound of the present disclosure is a nitrogen-containing heterocyclic aromatic ring, which has a particularly rigid fused ring. The compound has the following characteristics: a carbazole ring is prone to forming a relatively stable positive ion, has a large conjugation system and strong intramolecular electron transfer in the molecule, generally has high thermal stability and photochemical stability. It is easy to carry out structural modification on the carbazole ring by introducing various functional groups. Carbazole itself is one of the coal tar products, and thus the raw materials are readily available. In addition, the compound comprising a carbazole substituent having a total number of carbon atoms less than and equal to 30 and a mother nucleus has a moderate conjugation length, a strong absorption in a short wavelength range, an energy level band gap of about 3.2 eV. Thus, the compound is suitable to be used as an efficient blue-light-emitting materials.

According to an embodiment of the present disclosure, D is any one of the following groups:

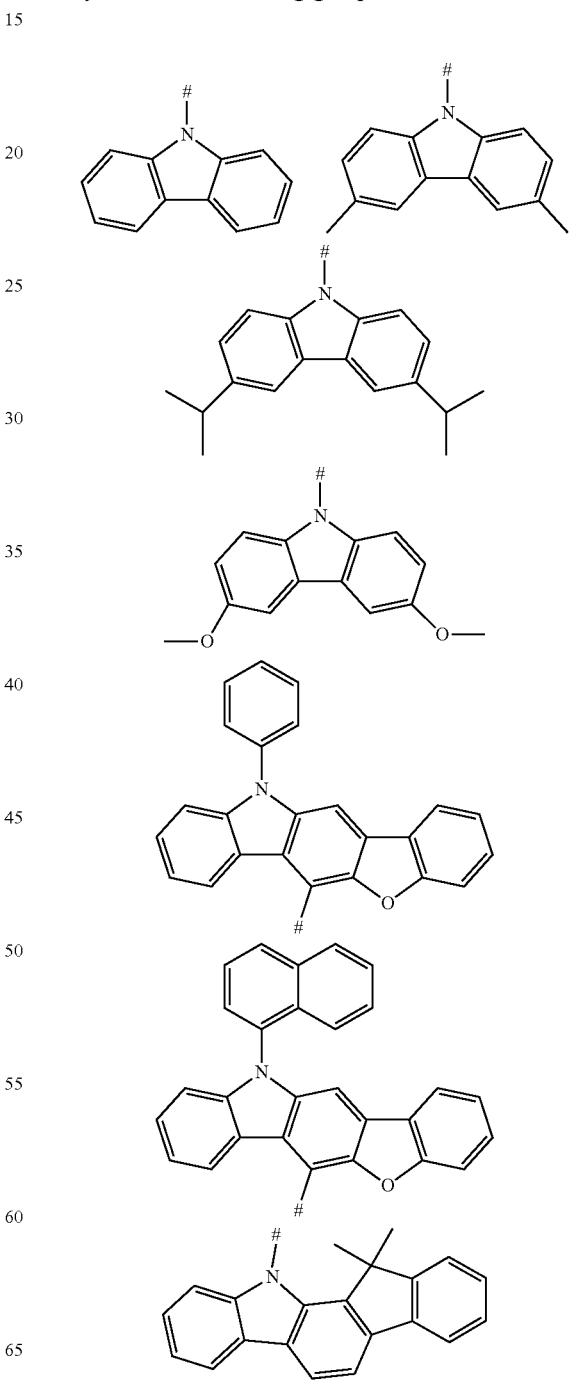

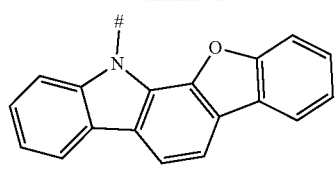
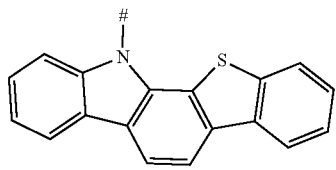
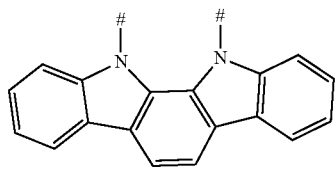
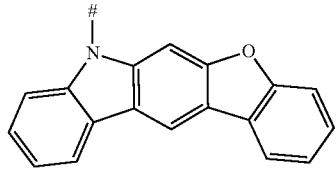
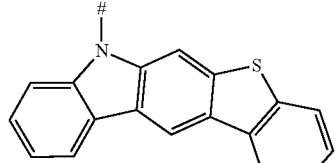
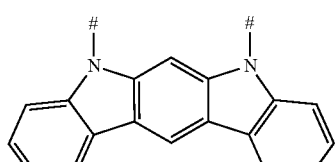
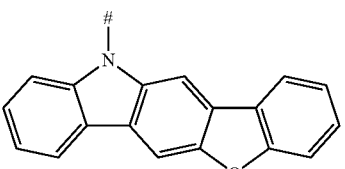
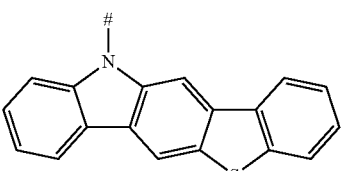
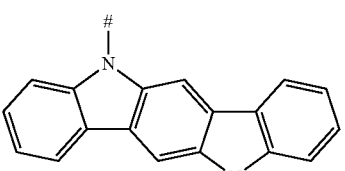
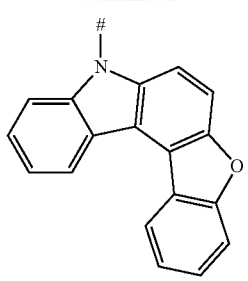
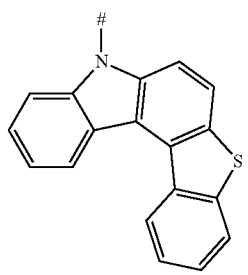
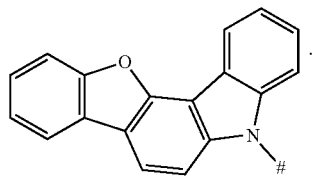
According to an embodiment of the present disclosure, D is according to any one of the following formulas:
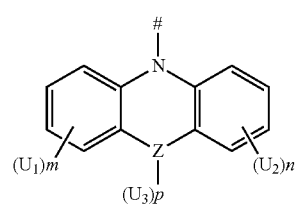
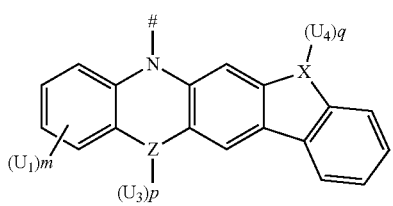
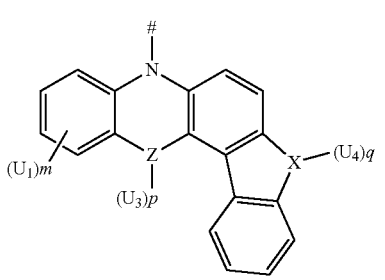

-continued

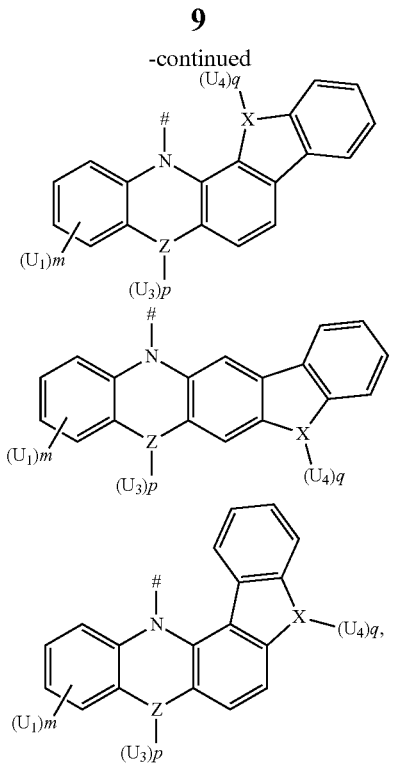

wherein

Z is selected from the group consisting of a carbon atom, a nitrogen atom, an oxygen atom, a sulfur atom and a silicon atom;

X is selected from the group consisting of a carbon atom, a nitrogen atom, an oxygen atom and a sulfur atom;

$U_1$, $U_2$, $U_3$ and $U_4$ are each independently selected from the group consisting of a hydrogen atom, C1-C6 alkyl, C3-C6 cycloalkyl, C1-C6 alkoxy, and C6-C12 aryl;

m, n, p and q are each an integer independently selected from 0, 1 and 2;

when Z is an oxygen atom or a sulfur atom, p is 0;

when X is an oxygen atom or a sulfur atom, q is 0; and indicates a bonding position.

In this embodiment, the acridinyl-containing compound of the present disclosure can form an ammonium ion radical under an external electric field. The nitrogen atom on the tertiary amine has a strong electron donating ability, and thus it is likely to be oxidized as a cationic radical (hole). Therefore, the compound has a better hole transmission property, accordingly.

According to an embodiment of the present disclosure, D is any one of the following groups:

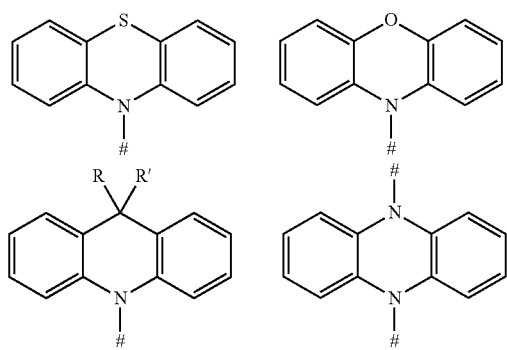

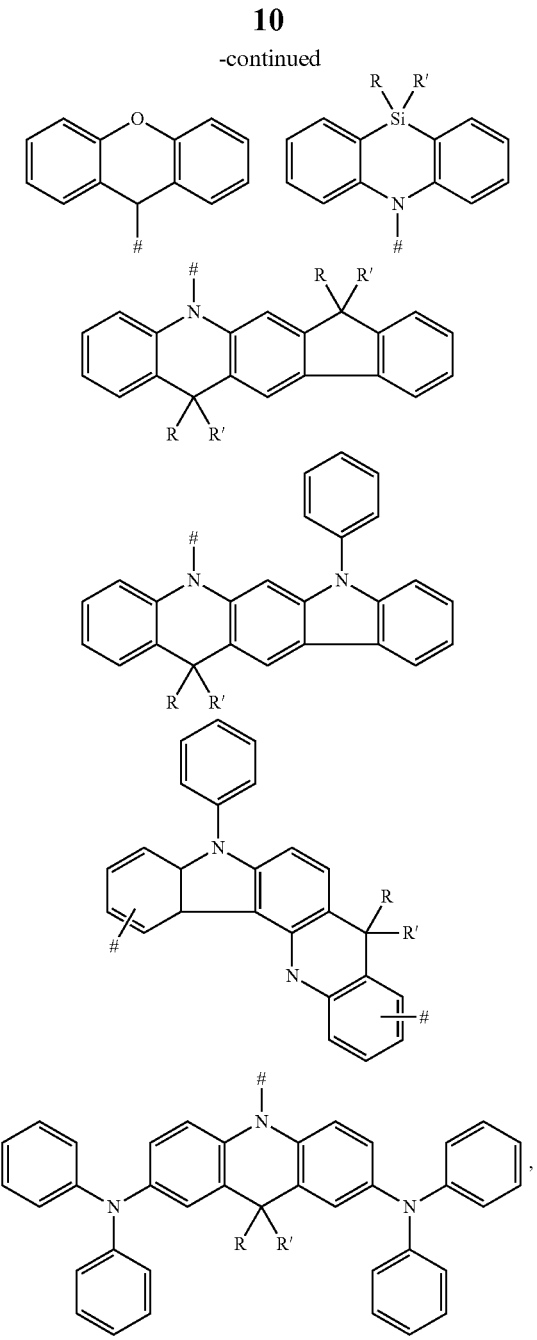

in which R and R' are each independently selected from the group consisting of a hydrogen atom, C1-C3 alkyl, and phenyl, and # indicates a bonding position.

In this embodiment, the phenoxazinyl in the compound of the present disclosure has the following beneficial effects: an electron donor on a nitrogen atom and lone pair electrons on an oxygen atom interact with the conjugation system, so that the excited state of the molecule is more prone to charge transfer, thereby producing better photoelectric conversion performance. Further, the compound comprises the phenoxazinyl group having a total carbon atom number less than or equal to 30 and a mother nucleus has a moderate conjugation length, which is suitable to be used as a highly efficient blue-light-emitting material.

According to an embodiment of the present disclosure, D is according to the following formula:

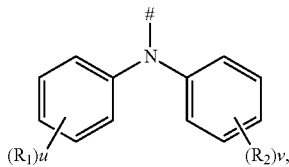

wherein $R_1$ and $R_2$ are each independently selected from the group consisting of a hydrogen atom, C1-C6 alkyl, and C1-C6 alkoxy;

u and v are each an integer independently selected from 0, 1, and 2; and indicates a bonding position.

The phenylamino-containing compound of the present disclosure can form an ammonium ion radical under the external electric field, and the nitrogen atom on tertiary amine has a strong electron donating ability, and thus it is likely to be oxidized as a cationic radical (hole). Therefore, the compound has an improved hole-transmission property. Further, a compound comprising the phenylamino substituent having a total carbon atom number less than or equal to 30 and a mother nucleus has a moderate conjugation length, which is suitable to be used as a highly efficient blue light-emitting material.

According to an embodiment of the present disclosure, D is selected from any one or more of the following groups:

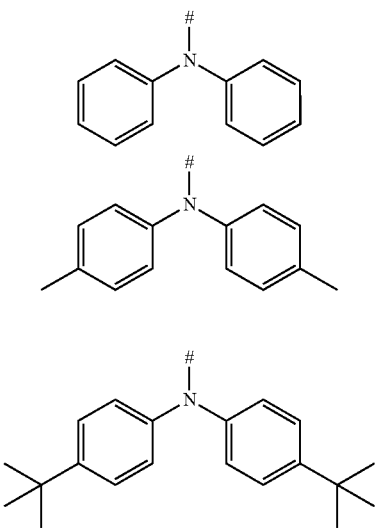

wherein # indicates a bonding position.

According to an embodiment of the present disclosure, D is according to the following formula:

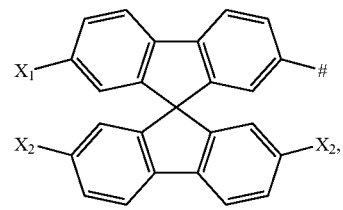

in which $X_1$, $X_2$ and $X_3$ are each independently selected from a hydrogen atom, C1-C6 alkyl, C1-C6 alkoxy, C6-C12 aryl, and oligothiophenyl, and indicates a bonding position.

In this embodiment, the spirobifluorenyl group is included in the compound of the present disclosure, and thus the compound has a large conjugation system and a unique spiro-conjugation effect. Further, the compound has a good rigid common surface, a high glass transition temperature, and is thermally stable. Regarding a spirocarbon compound, a rigid structure formed by two conjugation chains connected by sp3 hybridized carbon atoms can effectively prevent the formation of excitons, and can effectively inhibit strong inter-molecular interactions and non-radiative transitions during luminescence. Therefore, the light purity and light stability of the optical device can be effectively improved. In addition, when the electron donor D is spirobifluorenyl, the molecular structure has a moderate rigidity and is very suitable to be used as a highly efficient blue light-emitting material.

In an embodiment in which spirobifluorenyl is included, $X_1$, $X_2$ and $X_3$ are each oligothiophenyl. The introduction of the oligothiophenyl group increases the complexity of the stereostructure of the compound, and the coplanarity of the molecules is significantly deteriorated, such that the molecules are unlikely to be orderly arranged, thereby effectively preventing the aggregation of molecules. In this way, a degree of the amorphous form of the compound is increased, and the glass transition temperature is also significantly increased, thereby improving the application performance of the device.

According to an embodiment of the present disclosure, L is:

D is according to the following formula:

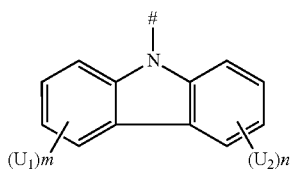

in which $U_1$ and $U_2$ are each independently selected from C1-C3 alkyl;

m and n are each an integer independently selected from 0, 1 and 2; and indicates a bonding position.

According to an embodiment of the present disclosure, L is:

D is according to the following formula:

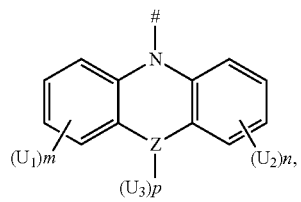

in which

Z is selected from the group consisting of a carbon atom, a nitrogen atom, an oxygen atom and a sulfur atom;

m and n are 0, and p is an integer selected from 0, 1 and 2;

$U_1$, $U_2$ and $U_3$ are each independently selected from the group consisting of C1-C3 alkyl and C6-C12 aryl;

when Z is an oxygen atom or a sulfur atom, p is 0; and indicates a bonding position.

In the compound of the present disclosure, when L is a phenyl, HOMO and LUMO can be more easily separated from each other. Moreover, the process preparation difficulty of the compound of the present disclosure can be reduced in actual preparation. Further, when L is the phenyl, the para-substitution can effectively adjust the spectrum of the compound and improve the thermal stability.

According to an embodiment of the present disclosure, L is:

and

D is according to the following formula:

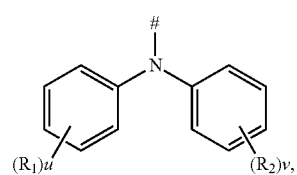

in which $R_1$ and $R_2$ are each independently selected from the group consisting of C1-C3 alkyl;

u and v are each an integer independently selected from 0, 1 and 2, and indicates a bonding position.

According to an embodiment of the present disclosure, the compound is selected from the following compounds:

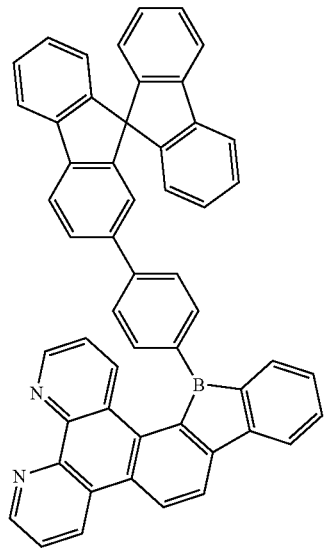

M1

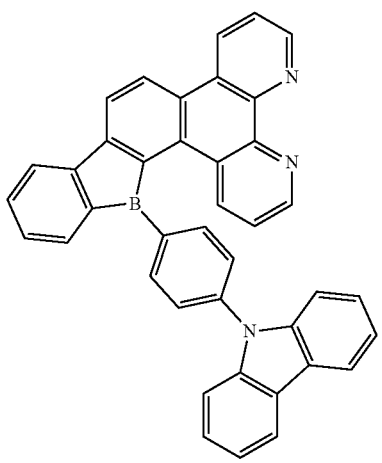

M2

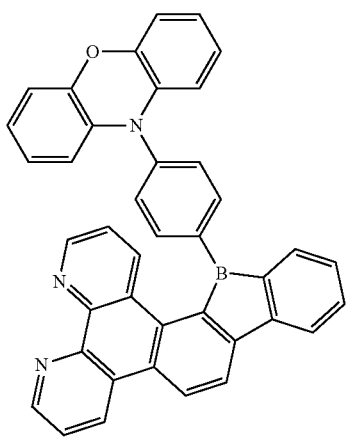

M3

M4
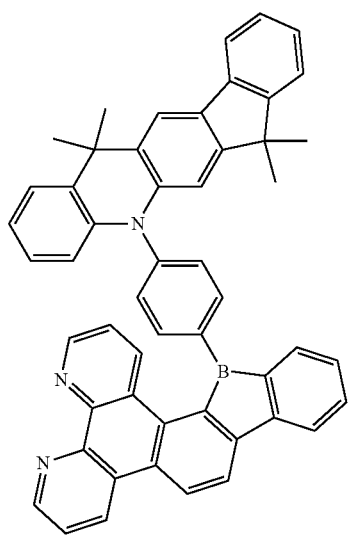
M5
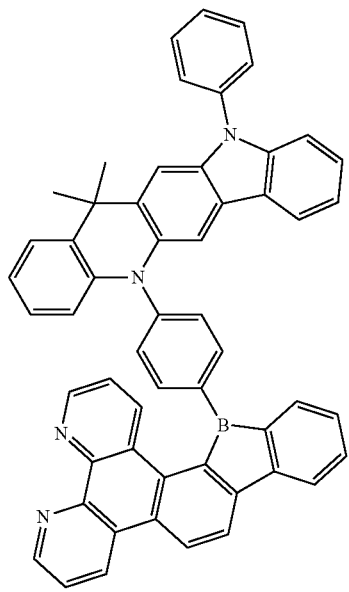
M6
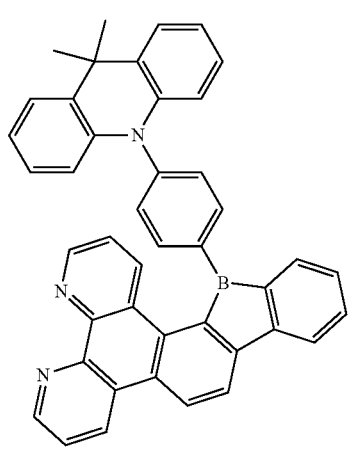
M7
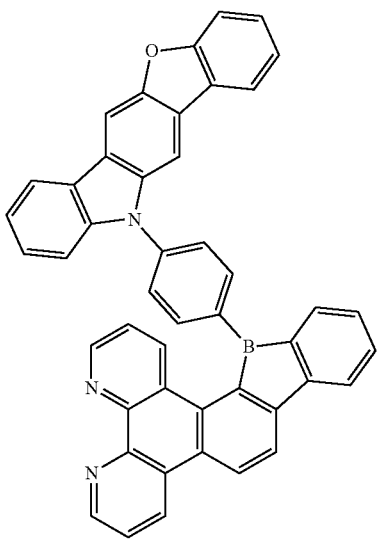
M8
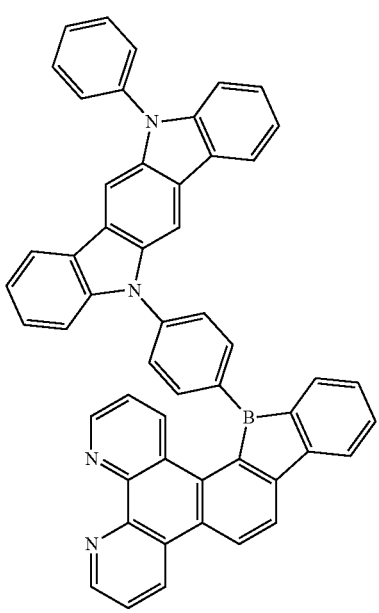

M9
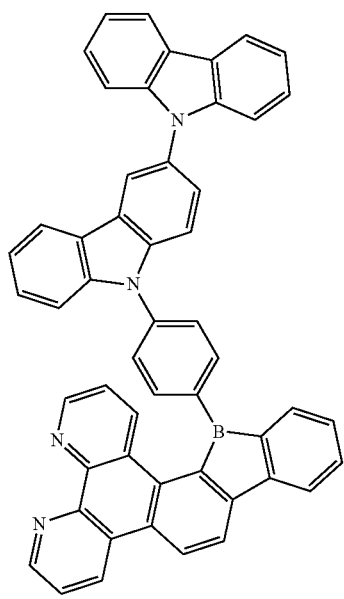
M10
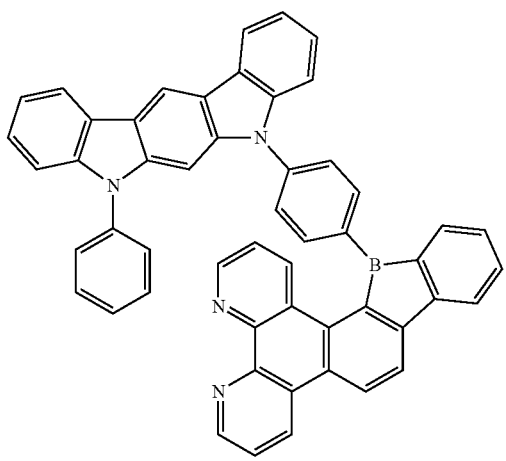
M11
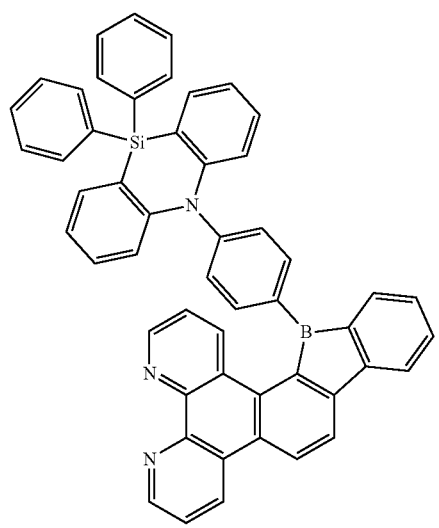
M12
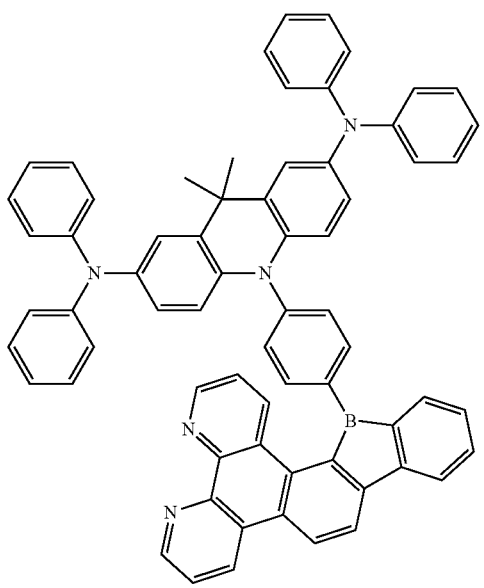
M13
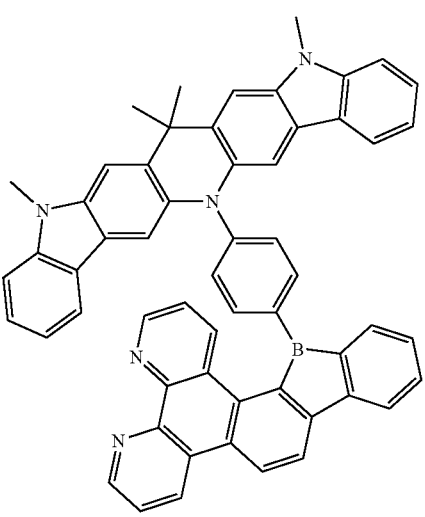
M14
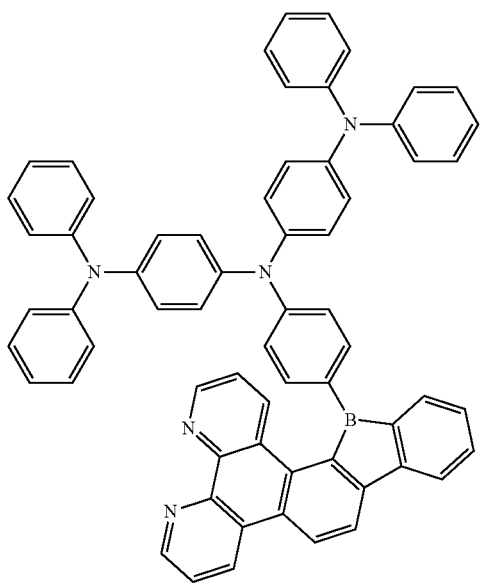

M15
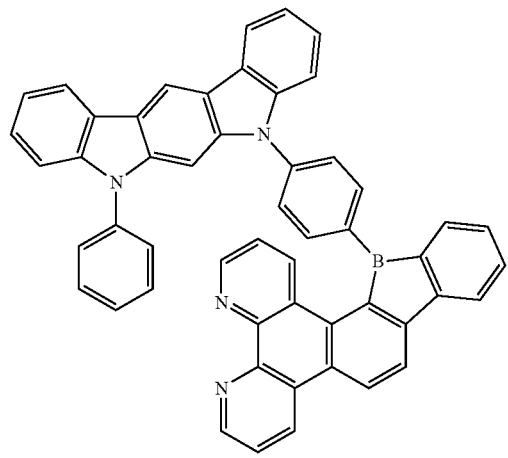
M16
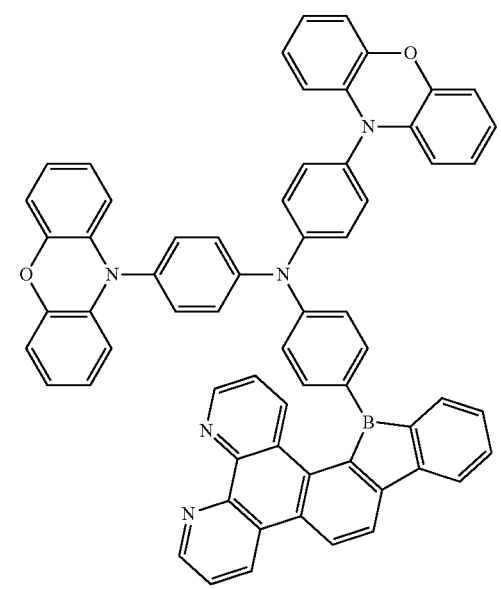
M17
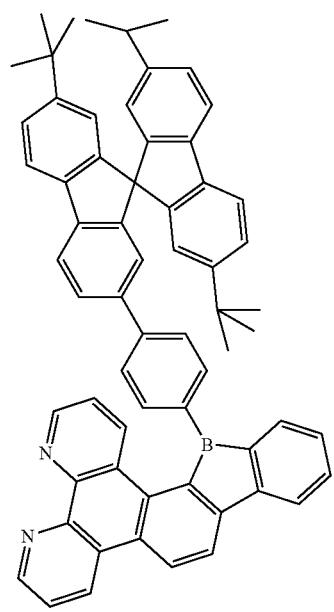
M18
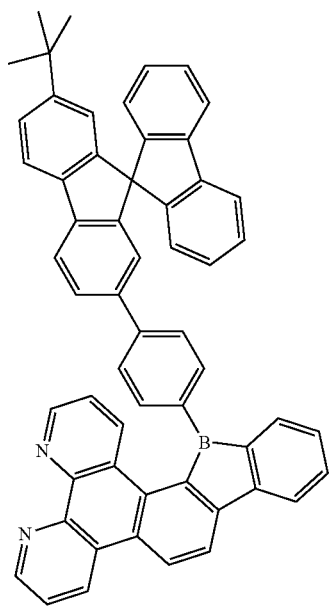
M19
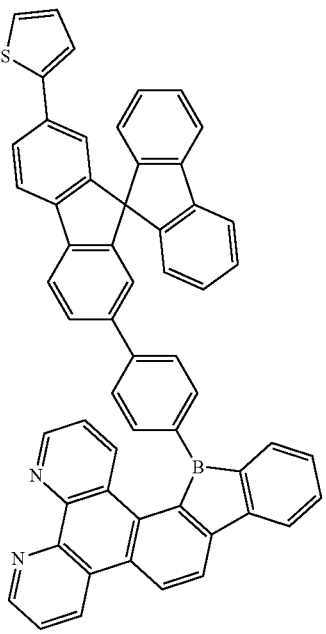

-continued

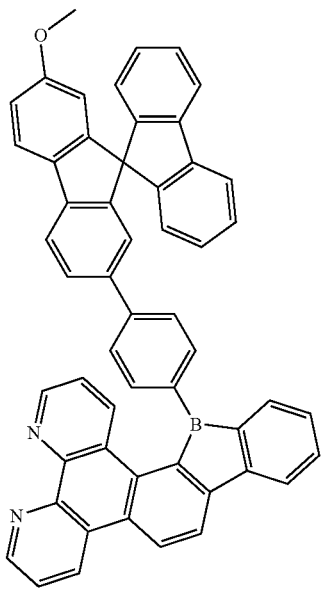

M20

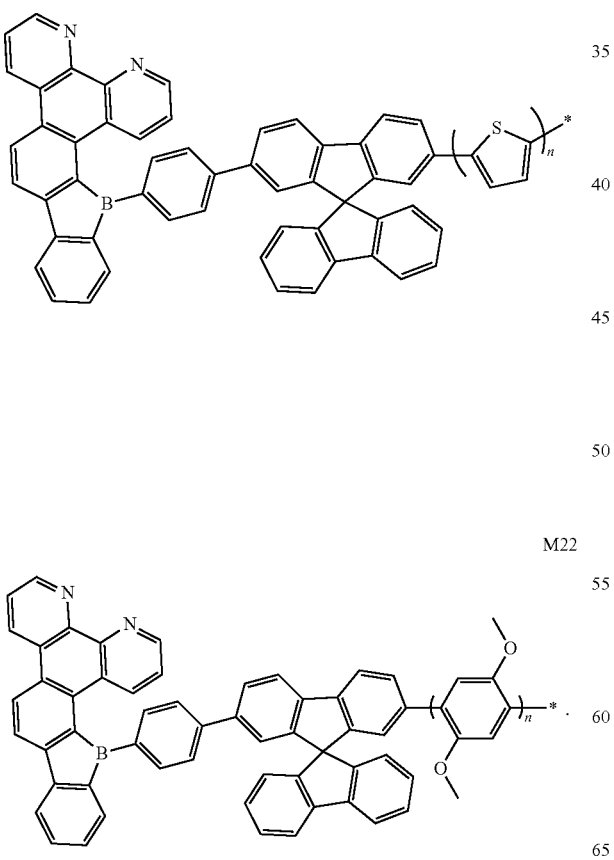

M21

M22

According to an embodiment of the present disclosure, when the compound is used as a blue light-emitting material, the electron donor D is a rigid molecular structure having a carbon atom number smaller than or equal to 30, such that the conjugate length is moderate and the thermal stability is good. That is, the compound is very suitable to be used as the blue light-emitting material.

According to an embodiment of the present disclosure, an energy difference $\Delta E_{st}$ between a lowest singlet energy level S1 of the compound and a lowest triplet energy level T1 of the compound satisfies an equation $\Delta E_{st}=E_{S1}-E_{T1}\leq 0.20$ eV.

The borocarbazole compound of the present disclosure has TADF property, and thus can be used as a host material or a guest material of an OLED light-emitting layer.

The second aspect of the present disclosure provides a display panel including an anode, a cathode, and a light-emitting layer between the anode and the cathode. A light-emitting material of the light-emitting layer includes one or more of the compounds as described above.

According to an embodiment of the present disclosure, the light-emitting material of the light-emitting layer includes a host material and a guest material, and the host material is one or more of the compounds as described above.

The third aspect of the present disclosure provides a display apparatus. The display apparatus includes the display panel as described above.

The preparation methods of the exemplary borocarbazole compounds M1, M2, M3 and M4 according to the present disclosure are described in Example 1 to Example 4.

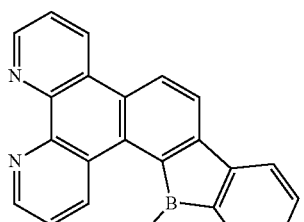

M1

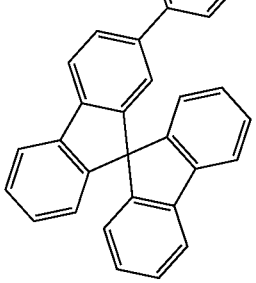

M2
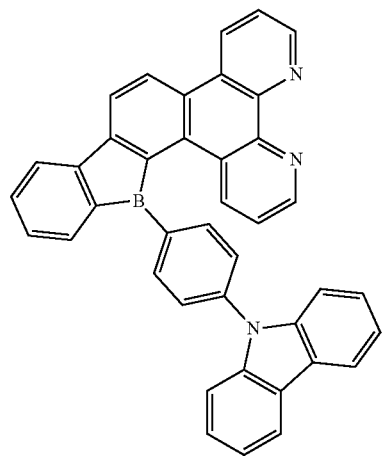
M3
M4
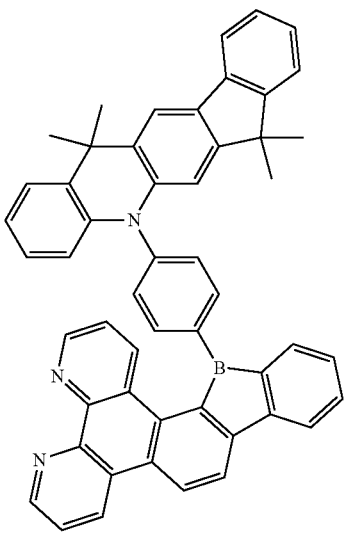
Example 1
Synthesis of Compound M1
A synthetic scheme of Compound M1 is as follows.
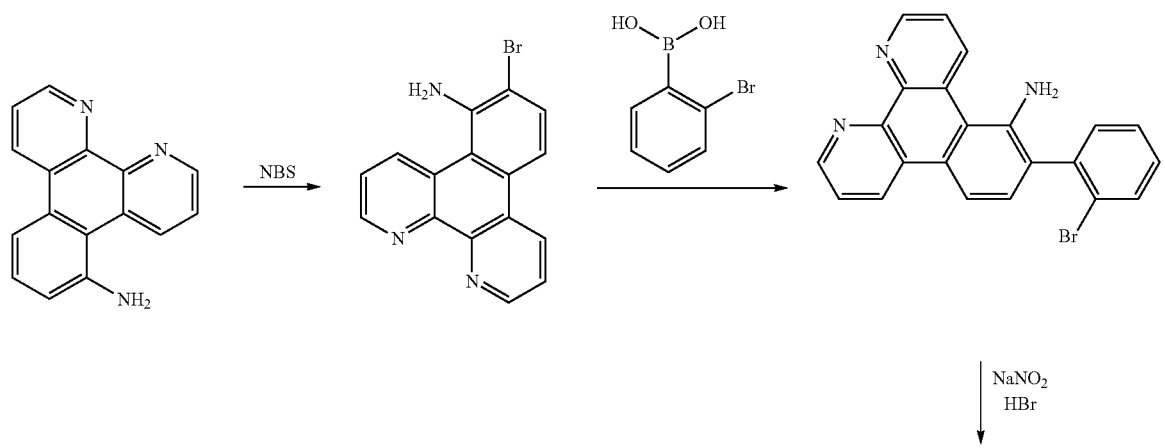

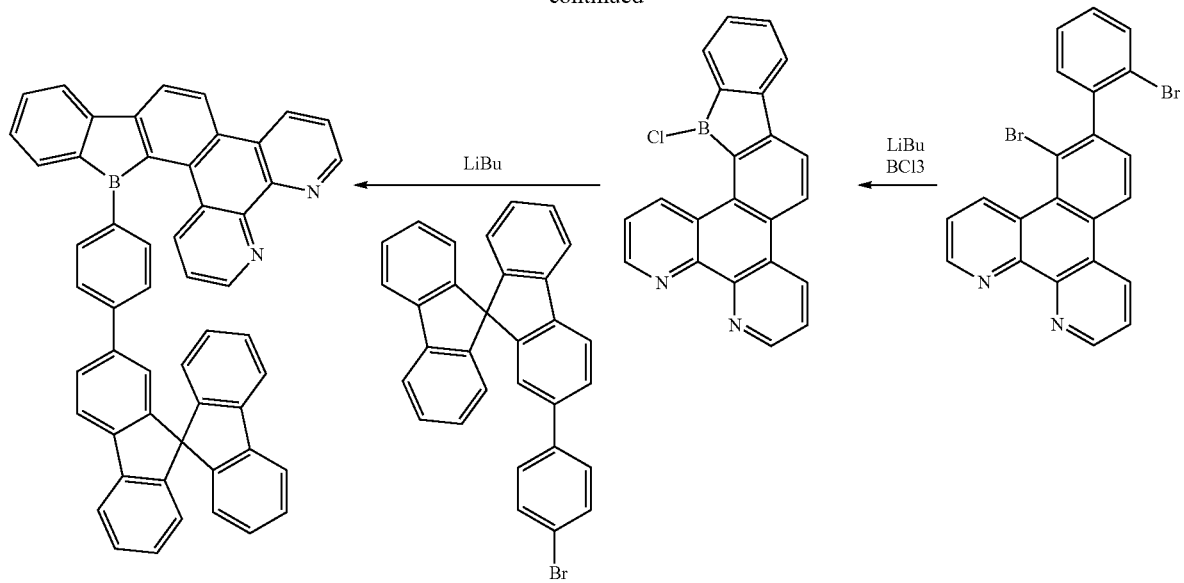

The specific synthetic steps of Compound M1 is as follows.

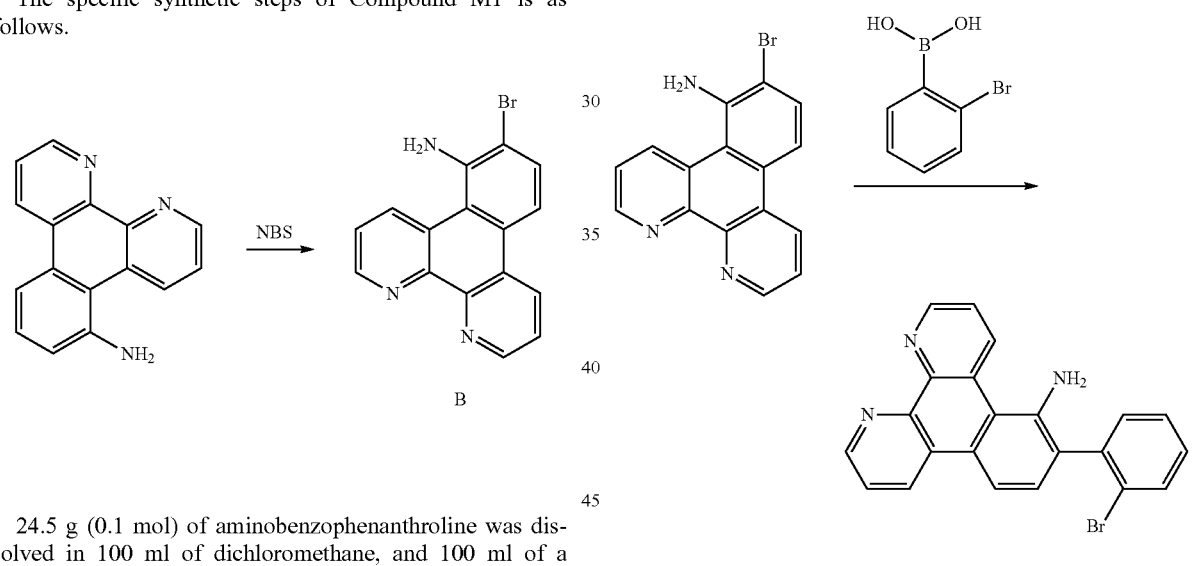

24.5 g (0.1 mol) of aminobenzophenanthroline was dissolved in 100 ml of dichloromethane, and 100 ml of a dichloromethane solution, in which 18.7 g (0.1 mol) of NBS was dissolved, was added dropwise in a nitrogen atmosphere. The mixture was stirred at room temperature for 4 h. After the reaction was stopped, the unreacted NBS was quenched by adding 5 ml of water in the reaction mixture, following by extracting the organic phase with 50 ml of dichloromethane for three times. After the solvent in the organic phase was removed through rotary evaporation, the mixture and 100 ml of n-hexane were refluxed and pulped overnight, then cooled to room temperature and filtered, so as to obtain 30.7 g of Compound B (99.5%, 95 mmol, 95% of yield).

$^1$H NMR (500 MHz, chloroform) δ 8.80 (s, 2H), 8.14 (s, 2H), 7.46 (s, 1H), 7.58-7.19 (m, 3H), 4.48 (s, 2H).

$^{13}$C NMR (125 MHz, common NMR solvent) δ 150.32 (s), 148.79 (s), 144.83 (s), 142.19 (s), 141.69 (s), 133.47 (s), 129.82 (s), 128.72 (s), 128.00 (s), 124.79 (s), 124.39 (s), 122.28 (s), 119.85 (s), 118.80 (s), 114.60 (s), 108.20 (s).

180 ml of water, 20 ml of ethanol, 30.78 g (95 mmol) of Compound B, 19.95 g (99.75 mmol) of o-bromobenzeneboronic acid, 39.33 g (285 mmol) of potassium carbonate, 38 mg of tetratriphenylphosphine palladium, 6.08 g of tetrabutylammonium bromide were added to a 250 ml flask with four necks, and then heated to 90° C. The reaction endpoint was monitored after 6 h. The mixture was then cooled to 25° C. and extracted with MTBE (3×100 mL). The organic phase was washed with water, dried with MgSO$_4$, and then vacuum concentrated. The crude product was purified by silica gel flash column chromatography (hexane) to obtain a yellow oily product C (35 g, 87.4 mmol, 92%).

$^1$H NMR (500 MHz, chloroform) δ 8.80 (s, 2H), 8.14 (s, 2H), 7.84 (s, 1H), 7.66 (s, 1H), 7.54 (s, 1H), 7.44 (s, 1H), 7.39 (s, 2H), 7.28 (d, J=15.0 Hz, 2H), 2.92 (s, 2H).

$^{13}$C NMR (125 MHz, common NMR solvent) δ 150.32 (s), 148.79 (s), 144.83 (s), 143.50 (s), 141.69 (s), 139.70 (s), 134.17 (s), 133.72 (s), 133.47 (s), 132.50 (s), 130.87 (s), 130.16 (s), 128.72 (s), 128.34 (s), 126.95 (s), 124.79 (s), 124.39 (s), 122.45 (s), 119.85 (s), 118.80 (s), 116.12 (s), 111.52 (s).

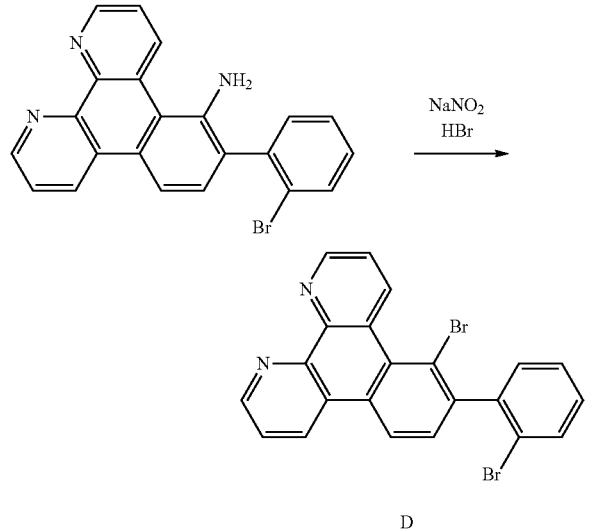

D

A mixture of 35 g (70 mmol) of product C, 18.38 g (262.5 mmol) of NaNO$_2$, 40.16 g (262.5 mol) of TMS-Br, 3.99 g (17.5 mmol) of TEBAC was added to 100 ml of CCl$_4$ at 0° C. The mixture was stirred at 0° C. for 1.5 h, and the temperature rose naturally. When the temperature reached the ambient temperature within 2 h, the mixture became transparent from a viscous state. After 8 hours, the supernatant was analyzed and revealed that the product C was almost quantitatively converted to compound D. Then 20 ml of water was added for quenching the reaction. The reaction solution was filtered, and the clear liquid was washed with 100 ml of water to be separated. After the organic phase was concentrated by removing the solvent, it was purified by using silica gel column to obtain Compound D (29.2 g, 98%, 62.9 mmol, 88% of yield).

$^1$H NMR (500 MHz, chloroform) δ 8.80 (s, 2H), 8.15 (d, J=1.4 Hz, 1H), 8.10 (d, J=45.0 Hz, 2H), 7.84 (s, 1H), 7.66 (s, 1H), 7.44 (s, 1H), 7.39 (s, 2H), 7.29 (s, 1H), 7.23 (s, 1H).

$^{13}$C NMR (125 MHz, common NMR solvent) δ 150.32 (s), 149.95 (s), 144.83 (s), 144.64 (s), 143.68 (s), 141.01 (s), 135.08 (s), 134.63 (s), 134.03 (s), 130.97 (s), 130.32 (s), 129.61 (s), 128.72 (s), 127.18 (s), 124.39 (s), 123.32 (s), 122.19 (s), 122.01 (s), 120.26 (s), 120.09 (s), 119.85 (s), 118.13 (s).

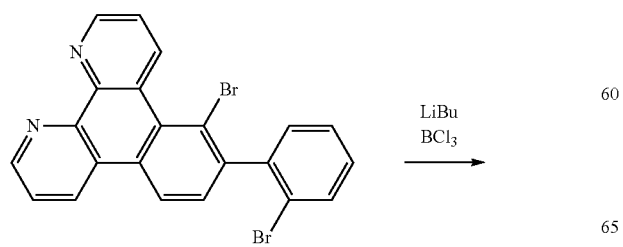

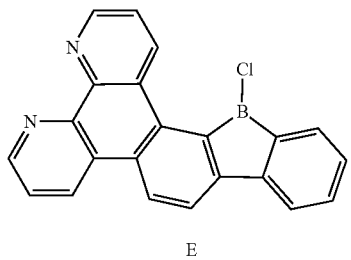

E

A solution of 2.5M n-BuLi in hexane (50.3 ml, 125.8 mmol) was slowly added dropwise to a solution of 29.2 g (62.9 mmol) of Compound D in toluene (500 ml) at room temperature. The reaction solution was refluxed for 5 h and cooled to 0° C., then solution of 1M BCl$_3$ in heptane (62.9 ml, 62.9 mmol) was added. The reaction solution gradually turned yellow, and continued stirring at room temperature for 15 h until the reaction end point was monitored. The unreacted n-BuLi was quenched by adding 100 ml of water, and the reaction solution was filtered and separated. After the organic phase was concentrated by removing the solvent, it was purified by using silica gel column to obtain Compound E (13.2 g, 37.74 mmol, 60% of yield).

$^1$H NMR (500 MHz, chloroform) δ 8.80 (s, 2H), 8.12 (d, J=25.0 Hz, 3H), 7.94 (s, 1H), 7.77 (s, 1H), 7.45 (dd, J=42.5, 12.5 Hz, 5H).

$^{13}$C NMR (125 MHz, common NMR solvent) δ 162.46 (s), 161.33 (s), 150.32 (s), 149.81 (s), 144.83 (s), 144.18 (s), 143.14 (s), 141.19 (s), 132.07 (s), 130.07 (d, J=6.9 Hz), 130.04 (s), 128.94 (s), 128.72 (s), 127.63 (s), 127.43 (s), 127.25 (s), 126.36 (s), 124.39 (s), 123.66 (s), 122.47 (s), 120.18 (s), 119.85 (s).

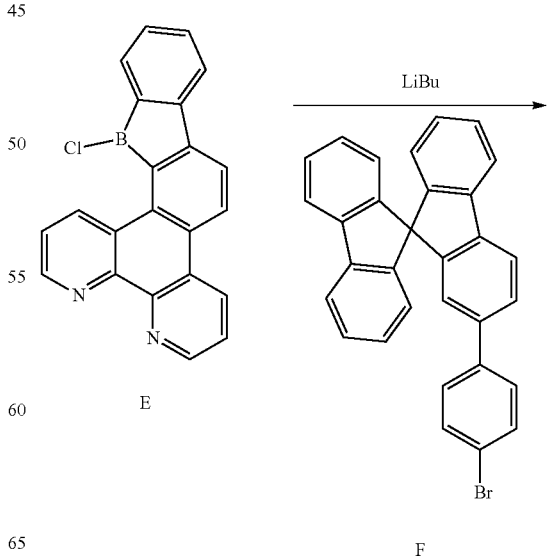

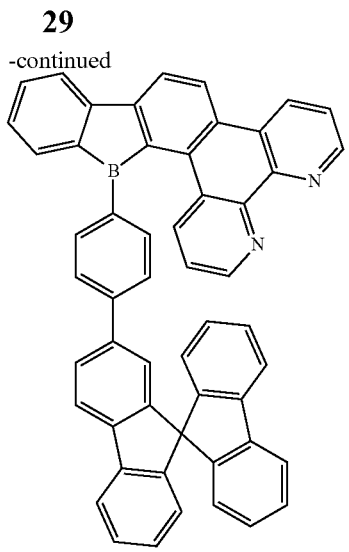

M

Example 2

Synthesis of Compound M2

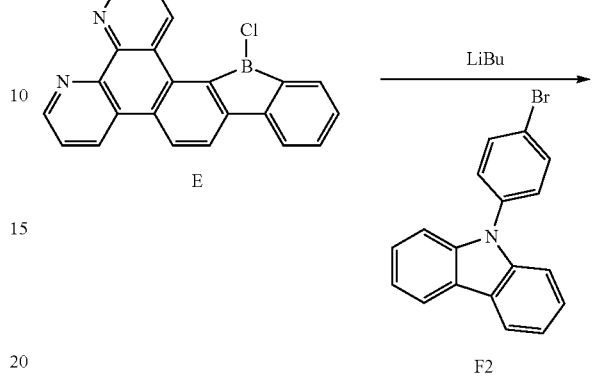

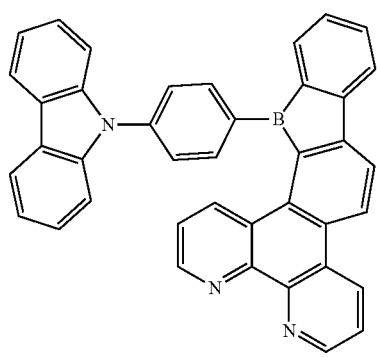

M2

Compound F (11.35 g, 28.7 mmol), Compound E (13.2 g, 37.74 mmol), Pd(PPh$_3$)$_4$ (1 g, 0.87 mmol), K$_2$CO$_3$ (12.05 g, 86.86 mmol), distilled water (23 ml), toluene (113.64 ml), and ethanol (23 mL) were mixed and stirred for 8 h with refluxing. The mixture was cooled to room temperature, added with distilled water, extracted with EA and dried with magnesium sulfate. After being concentrated, it was separated by using silica gel column to obtain Compound M1 (13.27 g, 18.8 mmol, 56% of yield).

$^1$H NMR (500 MHz, chloroform) δ 8.80 (dd, J=7.5, 1.4 Hz, 2H), 8.14 (dd, J=7.5, 1.4 Hz, 2H), 8.09 (d, J=7.5 Hz, 1H), 7.95 (d, J=1.6 Hz, 1H), 7.93 (d, J=1.4 Hz, 1H), 7.92-7.87 (m, 3H), 7.83 (s, 1H), 7.81 (s, 1H), 7.80 (d, J=1.6 Hz, 1H), 7.79-7.76 (m, 3H), 7.75-7.71 (m, 3H), 7.62 (td, J=7.5, 1.4 Hz, 1H), 7.53-7.46 (m, 3H), 7.44-7.35 (m, 4H), 7.27-7.20 (m, 4H).

$^{13}$C NMR (125 MHz, common NMR solvent) δ 150.32 (s), 149.81 (s), 147.58 (s), 147.28 (s), 146.01 (s), 145.52 (s), 144.83 (s), 143.14 (s), 141.93 (s), 139.30 (s), 138.82 (s), 137.02 (s), 134.09 (s), 133.74 (s), 130.49 (s), 130.07 (d, J=6.8 Hz), 129.08 (s), 128.72 (s), 127.55 (d, J=0.6 Hz), 126.88 (s), 126.78-126.60 (m), 126.14 (s), 125.28 (d, J=7.4 Hz), 124.39 (s), 123.80 (s), 123.62 (s), 122.47 (s), 121.91 (s), 121.60 (d, J=3.7 Hz), 120.18 (s), 119.86 (d, J=1.7 Hz), 115.94 (s), 109.74 (s), 61.28 (s).

Compound F2 (9.24 g, 28.7 mmol), Compound E (13.2 g, 37.74 mmol), Pd(PPh$_3$)$_4$ (1 g, 0.87 mmol), K$_2$CO$_3$ (12.05 g, 86.86 mmol), distilled water (23 ml), toluene (113.64 ml), and ethanol (23 mL) were mixed and stirred for 8 h with refluxing. The mixture was cooled to room temperature, added with distilled water, extracted with EA and dried with magnesium sulfate. After being concentrated, it was separated by using silica gel column to obtain Compound M2 (10.5 g, 18.8 mmol, 56% of yield).

$^1$H NMR (500 MHz, chloroform) δ 8.80 (dd, J=7.5, 1.4 Hz, 2H), 8.14 (dd, J=7.5, 1.4 Hz, 2H), 8.09 (d, J=7.5 Hz, 1H), 7.95 (d, J=1.6 Hz, 1H), 7.93 (d, J=1.4 Hz, 1H), 7.92-7.87 (m, 3H), 7.83 (s, 1H), 7.81 (s, 1H), 7.80 (d, J=1.6 Hz, 1H), 7.79-7.76 (m, 3H), 7.75-7.71 (m, 3H), 7.62 (td, J=7.5, 1.4 Hz, 1H), 7.53-7.46 (m, 3H), 7.44-7.35 (m, 4H), 7.27-7.20 (m, 4H).

$^{13}$C NMR (125 MHz, common NMR solvent) δ 150.32 (s), 149.81 (s), 147.58 (s), 147.28 (s), 146.01 (s), 145.52 (s), 144.83 (s), 143.14 (s), 141.93 (s), 139.30 (s), 138.82 (s), 137.02 (s), 134.09 (s), 133.74 (s), 130.49 (s), 130.07 (d, J=6.8 Hz), 129.08 (s), 128.72 (s), 127.55 (d, J=0.6 Hz), 126.88 (s), 126.78-126.60 (m), 126.14 (s), 125.28 (d, J=7.4 Hz), 124.39 (s), 123.80 (s), 123.62 (s), 122.47 (s), 121.91 (s), 121.60 (d, J=3.7 Hz), 120.18 (s), 119.86 (d, J=1.7 Hz), 115.94 (s), 109.74 (s), 61.28 (s).

Example 3

Synthesis of Compound M3

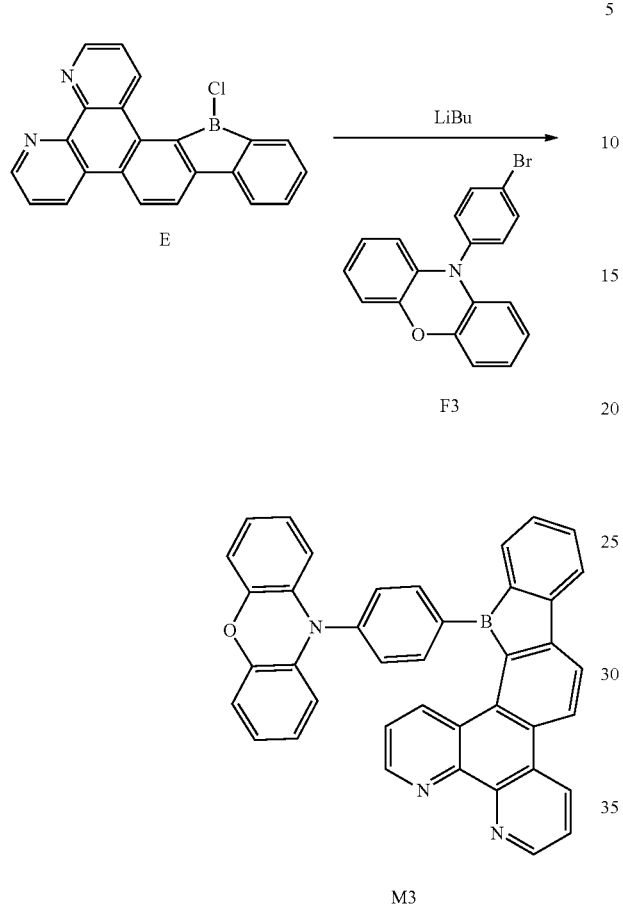

Compound F3 (9.7 g, 28.7 mmol), Compound E (13.2 g, 37.74 mmol), Pd(PPh$_3$)$_4$ (1 g, 0.87 mmol), K$_2$CO$_3$ (12.05 g, 86.86 mmol), distilled water (23 ml), toluene (113.64 ml), and ethanol (23 mL) were mixed and stirred for 8 h with refluxing. The mixture was cooled to room temperature, added with distilled water, extracted with EA and dried with magnesium sulfate. After being concentrated, it was separated by using silica gel column to obtain Compound M3 (10.78 g, 18.8 mmol, 56% of yield).

$^1$H NMR (500 MHz, chloroform) δ 8.80 (dd, J=7.5, 1.4 Hz, 2H), 8.14 (dd, J=7.5, 1.4 Hz, 2H), 8.09 (d, J=7.5 Hz, 1H), 7.95 (d, J=1.6 Hz, 1H), 7.93 (d, J=1.4 Hz, 1H), 7.92-7.87 (m, 3H), 7.83 (s, 1H), 7.81 (s, 1H), 7.80 (d, J=1.6 Hz, 1H), 7.79-7.76 (m, 3H), 7.75-7.71 (m, 3H), 7.62 (td, J=7.5, 1.4 Hz, 1H), 7.53-7.46 (m, 3H), 7.44-7.35 (m, 4H), 7.27-7.20 (m, 4H).

$^{13}$C NMR (125 MHz, common NMR solvent) δ 150.32 (s), 149.81 (s), 147.58 (s), 147.28 (s), 146.01 (s), 145.52 (s), 144.83 (s), 143.14 (s), 141.93 (s), 139.30 (s), 138.82 (s), 137.02 (s), 134.09 (s), 133.74 (s), 130.49 (s), 130.07 (d, J=6.8 Hz), 129.08 (s), 128.72 (s), 127.55 (d, J=0.6 Hz), 126.88 (s), 126.78-126.60 (m), 126.14 (s), 125.28 (d, J=7.4 Hz), 124.39 (s), 123.80 (s), 123.62 (s), 122.47 (s), 121.91 (s), 121.60 (d, J=3.7 Hz), 120.18 (s), 119.86 (d, J=1.7 Hz), 115.94 (s), 109.74 (s), 61.28 (s).

Example 4

Synthesis of Compound M4

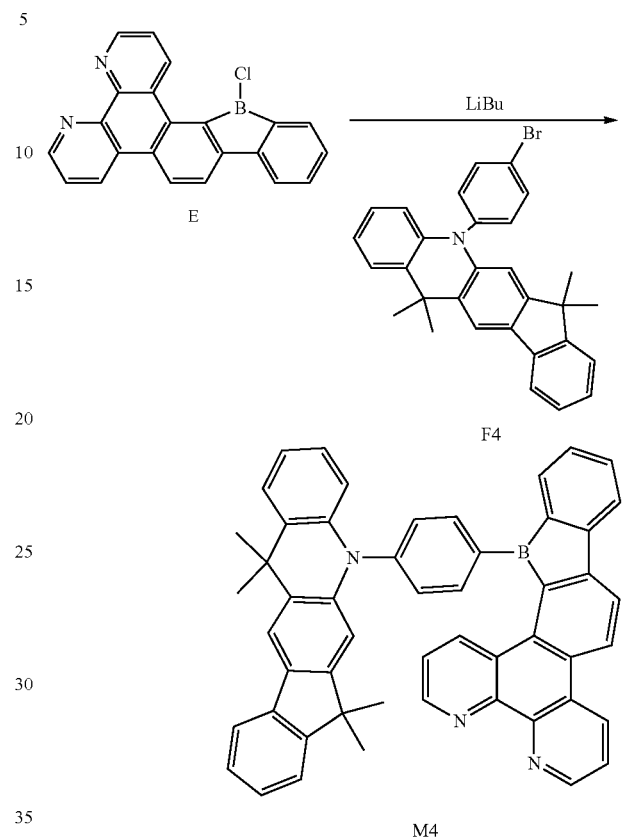

Compound F (10.92 g, 28.7 mmol), Compound E (13.2 g, 37.74 mmol), Pd(PPh$_3$)$_4$ (1 g, 0.87 mmol), K$_2$CO$_3$ (12.05 g, 86.86 mmol), distilled water (23 ml), toluene (113.64 ml), and ethanol (23 mL) were mixed and stirred for 8 h with refluxing. The mixture was cooled to room temperature, added with distilled water, extracted with EA and dried with magnesium sulfate. After being concentrated, it was separated by using silica gel column to obtain Compound M4 (13.46 g, 18.8 mmol, 56% of yield).

$^1$H NMR (500 MHz, chloroform) δ 8.80 (dd, J=7.5, 1.4 Hz, 2H), 8.14 (dd, J=7.5, 1.4 Hz, 2H), 8.09 (d, J=7.5 Hz, 1H), 7.95 (d, J=1.6 Hz, 1H), 7.93 (d, J=1.4 Hz, 1H), 7.92-7.87 (m, 3H), 7.83 (s, 1H), 7.81 (s, 1H), 7.80 (d, J=1.6 Hz, 1H), 7.79-7.76 (m, 3H), 7.75-7.71 (m, 3H), 7.62 (td, J=7.5, 1.4 Hz, 1H), 7.53-7.46 (m, 3H), 7.44-7.35 (m, 4H), 7.27-7.20 (m, 4H).

$^{13}$C NMR (125 MHz, common NMR solvent) δ 150.32 (s), 149.81 (s), 147.58 (s), 147.28 (s), 146.01 (s), 145.52 (s), 144.83 (s), 143.14 (s), 141.93 (s), 139.30 (s), 138.82 (s), 137.02 (s), 134.09 (s), 133.74 (s), 130.49 (s), 130.07 (d, J=6.8 Hz), 129.08 (s), 128.72 (s), 127.55 (d, J=0.6 Hz), 126.88 (s), 126.78-126.60 (m), 126.14 (s), 125.28 (d, J=7.4 Hz), 124.39 (s), 123.80 (s), 123.62 (s), 122.47 (s), 121.91 (s), 121.60 (d, J=3.7 Hz), 120.18 (s), 119.86 (d, J=1.7 Hz), 115.94 (s), 109.74 (s), 61.28 (s).

Example 5

The electroluminescent properties of the exemplary borocarbazole compounds M1, M2, M3 and M4 described in the present disclosure were simulated by means of Gaussian software.

Figure 2:
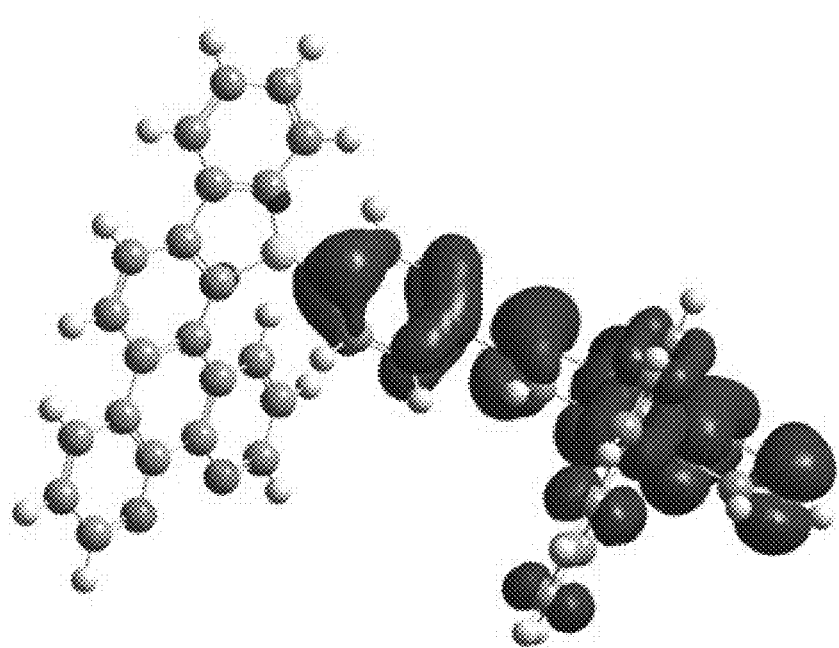
FIG. 2 is a HOMO distribution diagram of the borocarbazole compound M1 according to the present disclosure.
Figure 3:
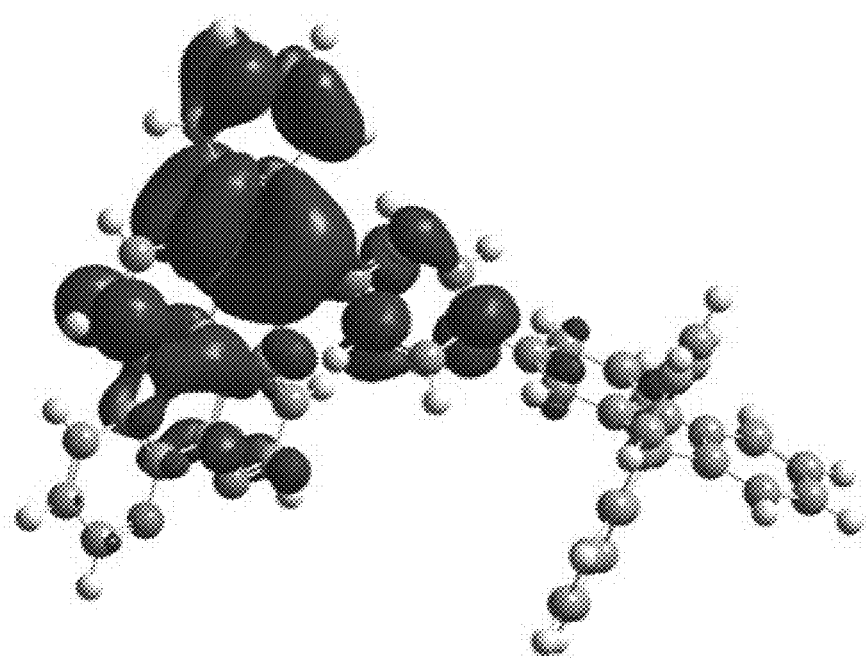
FIG. 3 is a LUMO distribution diagram of the borocarbazole compound M1 according to the present disclosure.

FIG. 2 and FIG. 3 respectively show HOMO and LUMO energy level diagrams of the borocarbazole compound M1 of the present disclosure. It can be clearly seen from FIG. 2 and FIG. 3 that the HOMO and LUMO of the compound molecule M1 are respectively located on the donor unit and the acceptor unit, avoiding the complete separation of HOMO and LUMO. This is conducive to the reduction of difference of intersystem energy $\Delta E_{ST}$, thereby improving the reverse intersystem crossing ability.

The HOMO, LUMO and other parameters of the borocarbazole compounds M1, M2, M3 and M4 were measured, and the results obtained are shown in Table 1.

TABLE 1

Parameters of four representative borocarbazole compounds

| Compound | HOMO (ev) | LUMO (ev) | $S_1$ (ev) | $T_1$ (ev) | $\Delta E_{ST}$ (ev) | τ (μS) |
|---|---|---|---|---|---|---|
| M1 | −5.74 | −2.58 | 2.6 | 2.52 | 0.08 | 6.4 |
| M2 | −5.54 | −2.62 | 2.73 | 2.62 | 0.11 | 1.9 |
| M3 | −5.22 | −2.66 | 2.51 | 2.44 | 0.07 | 4.8 |
| M4 | −5.52 | −2.47 | 2.76 | 2.63 | 0.13 | 2.1 |

As can be seen from Table 1, the borocarbazole compound of the present disclosure has a significantly lower LUMO energy level, thereby making electronic transitions more likely to occur. The energy level difference $\Delta E_{st} = E_{S1} - E_{T1} \leq 0.2$ eV between the lowest singlet energy level S1 and the lowest triplet energy level T1 of the borocarbazole compound of the present disclosure achieves a small energy level difference, being suitable as a thermally activated delayed fluorescent material. In Table 1, S1 represents the singlet energy level, T1 represents the triplet energy level, $\Delta E_{ST}$ represents the energy level difference, and τ represents the exciton lifetime.

Another aspect of the present disclosure provides a display panel including an organic light-emitting device. The organic light-emitting device includes an anode, a cathode, and a light-emitting layer disposed between the anode and the cathode. A light-emitting material of the light-emitting layer includes one or more of the borocarbazole compounds according to the present disclosure.

According to an embodiment of the display panel of the present disclosure, the light-emitting material of the light-emitting layer includes a host material and a guest material. The host material is one or more of the compounds according to the disclosure.

According to an embodiment of the display panel of the present disclosure, the organic light-emitting device further includes one or more layers of a hole injection layer, a hole transmission layer, an electron blocking layer, a hole blocking layer, an electron transmission layer or an electron injection layer.

Figure 4:
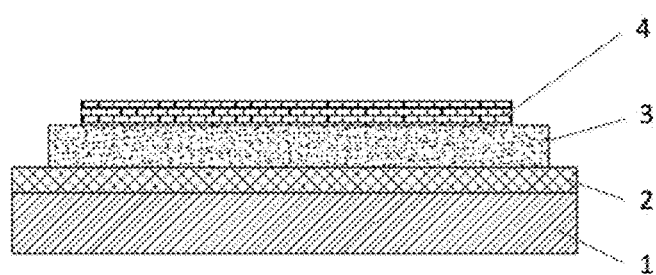
FIG. 4 is a structural schematic diagram of an OLED according to the present disclosure.

In one embodiment of the display panel of the present disclosure, the organic light-emitting device (such as OLED) has a structure shown in FIG. 4. A substrate made of glass or other suitable material (such as plastic) is denoted with reference number 1; a transparent anode such as ITO or IGZO is denoted with reference number 2 is; an organic film layer, which includes a light-emitting layer, is denoted with reference number 3; a metal cathode is denoted with reference number 4. All of the above constitutes a complete OLED device. The two electrodes 1 and 4 can be interchanged.

In the display panel provided by the present disclosure, the anode of the organic light-emitting device can be made of metal such as copper, gold, silver, iron, chromium, nickel, manganese, palladium, platinum, or alloys thereof. The anode can also be made of metal oxides such as indium oxide, zinc oxide, indium tin oxide (ITO), indium zinc oxide (IZO), or the like. The anode can also be made of a conductive polymer such as polyaniline, polypyrrole, poly (3-methylthiophene), or the like. In addition to the anode materials mentioned above, the anode can also be made of any suitable material known in the related art, or combinations thereof, as long as the material is conductive to hole injection.

In the display panel provided by the present disclosure, the cathode of the organic light-emitting device can be made of metal such as aluminum, magnesium, silver, indium, tin, titanium, or alloys thereof. The cathode also can be made of multiple-layered metal material, such as LiF/Al, $LiO_2$/Al, $BaF_2$/Al, or the like. In addition to the cathode materials listed above, the cathode also can be made of any suitable material known in the related art, or combinations thereof, as long as the material of the cathode is conductive to hole injection.

In the display panel of the present disclosure, the organic light-emitting device can be manufactured by the following steps: forming an anode on a transparent or opaque smooth substrate; forming an organic thin layer on the anode; and further forming a cathode on the organic thin layer. The organic thin layer can be formed with a known method such as vapor deposition, sputtering, spin coating, dipping, ion plating, and the like.

The following Examples 6 and 7 are exemplary for illustrating the practical application of the borocarbazole compounds of the present disclosure in organic display panels.

Example 6

The organic light-emitting device are manufactured as follows:

The anode substrate including an ITO film having a film thickness of 100 nm was ultrasonically washed with distilled water, acetone, and isopropanol, then dried in an oven. The surface was subjected to UV treatment for 30 minutes, and then the substrate was transferred to a vacuum vapor deposition chamber. The vapor deposition of each layer was carried out under a vacuum of $2 \times 10^{-6}$ Pa. A hole injection layer was formed by depositing 5 nm of HATCN. A hole transmission layer (HTL) was then formed by depositing a 40 nm thickness of N,N'-diphenyl-N,N'-(1-naphthyl)-1,1'-biphenyl-4,4'-diamine(α-NPD), and then depositing 4,4',4''-tris(carbazole-9-yl)triphenylamine (TCTA). The targeted compound according to the present disclosure was used as a dopant in the light-emitting layer, 3,3'-bis (N-carbazolyl)-1,1'-biphenyl (mCBP) was used as a host material of the light-emitting layer, the dopant and the host material were vapor deposited at the same time, so as to form a light-emitting having a thickness of 35 nm. Then, diphenyl[4-(triphenylsilyl)phenyl]phosphine oxide (TSPO1) was deposited on the light-emitting layer to form a hole blocking layer (HBL) having a thickness of 5 nm. 4,7-diphenyl-1,10-phenanthroline (Bphen) was deposited on the hole blocking layer to form an electron transmission layer (ETL) having a thickness of 30 nm. A LiF layer having a thickness of 2.5 nm and an Al layer having a thickness of 100 nm were deposited on the electron transmission layer sequentially, respectively serving as an electron injection layer (EIL) and a cathode, so as to manufacture an organic light-emitting display apparatus.

For example, the borocarbazole compounds M1 according to the present disclosure was used as fluorescent dopant to design the following light-emitting device D1. The light-emitting device D1 has the following structure:

ITO(100 nm)/HATCN (5 nm)/α-NPD (40 nm)/TCTA (10 nm)/CBP:M1 (35 nm, 8%)/TSPO1 (5 nm)/Bphen (30 nm)/LiF (2.5 nm)/Al (100 nm).

On basis of the structure of the said light-emitting device, the fluorescent dopant of borocarbazole compound M1 in the above-mentioned light-emitting device was replaced with the borocarbazole compounds M2, M3 and M4 according to the present disclosure, respectively, so as to design the light-emitting devices D2, D3, and D4.

In contrast, on basis of the structure of the above-described light-emitting device, the fluorescent dopant of the borocarbazole compound M1 according to the present disclosure was replaced with DCJTB to design a comparative device $D_{ref}$.

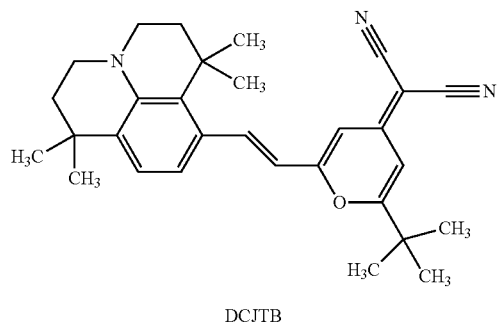 [SMILES: CC(C)(C)C1=CC(=C(C#N)C#N)C=C(/C=C/c2ccc3c4c2C(C)(C)CCN4CCC3(C)C)O1]

DCJTB

Example 7

For example, the following light-emitting devices D1, D2, D3, and D4 were respectively designed by using the borocarbazole compounds M1, M2, M3 and M4 of the present disclosure as fluorescent dopants.

The OLED devices employing the compounds of the present disclosure have a higher external quantum efficiency (EQE) of up to 6.97%. Compared with the comparative example $D_{ref}$, the borocarbazole compound of the present disclosure has the TADF property. When the TADF compounds of the present disclosure are used in an organic light-emitting device, the triplet excitons, which are blocked in molecular transition of the conventional fluorescent material, can be used to emit light, thereby improving the efficiency of device. Meanwhile, the TADF material containing the carbazolyl group has the bipolar property, and when it is used as a material of the light-emitting layer, the transmission ability of the two types of carriers can be greatly improved and the carrier balance can be improved, and the fluorescence external quantum efficiency can reach up to 6.97%.

Yet another aspect of the present disclosure also provides a display apparatus including the organic light-emitting display panel as described above.

Figure 5:
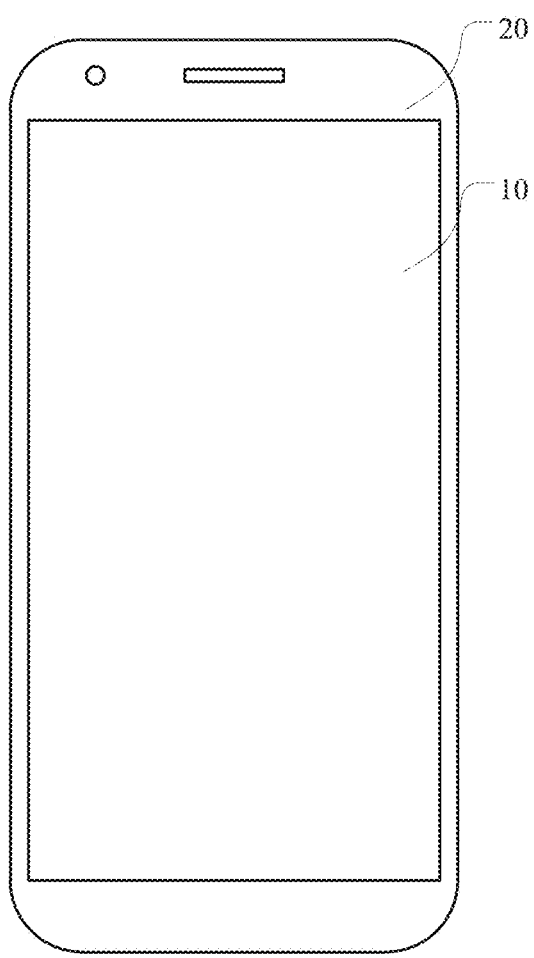
FIG. 5 is a schematic diagram of a display apparatus according to an embodiment of the present disclosure.

In the present disclosure, the organic light-emitting device can be an OLED, which may be used in an organic light-emitting display apparatus. The organic light-emitting apparatus can be a mobile phone display screen, a computer display screen, a liquid crystal television display screen, a smart watch display screen, or a smart car display panel, VR or AR helmet display screen, or display screens of various smart devices. FIG. 5 is a schematic diagram of a display apparatus according to an embodiment of the present disclosure, in which the display panel of mobile phone is denoted with reference number 10, the display device is denoted with reference number 20.

The above embodiments of the present disclosure are several preferred embodiments, but not intended to limit the scope of the claims. Any change and modification can be made by those skilled in the art without departing from the scope of the present application, and the protection scope is defined by the claims.

What is claimed is:

1. A compound, having a structure represented by Formula (I):

TABLE 2

Measurement results of the luminescence properties of the devices

| Device | Compound | Doped or not | $V_{turn-on}$ [V] | $E_{L(max)}/E_{L(10mA/cm^2)}$ (cd A$^{-1}$) | $h_{p(max)}$ (lm W$^{-1}$) | $EQE_{(max)}$ (%) | CIE (x, y) |
|---|---|---|---|---|---|---|---|
| D1 | M1 | Yes | 2.8 | 7.47/6.91 | 7.76 | 6.97 | (0.140, 0.121) |
| D2 | M2 | Yes | 2.7 | 12.80/10.56 | 4.60 | 5.37 | (0.181, 0.110) |
| D3 | M3 | Yes | 3.2 | 10.09/9.3 | 6.90 | 4.33 | (0.133, 0.385) |
| D4 | M4 | Yes | 2.9 | 15.43/13.42 | 8.48 | 5.62 | (0.144, 0.225) |
| $D_{ref}$ | DCJTB | Yes | 3.1 | 3.76/3.73 | 2.9 | 2.77 | (0.146, 0.144) |

$V_{turn-on}$: turn-on voltage; $E_{L(1\ mA/cm2)}$: current efficiency at a current density of 10 mA/cm²; $PE_{(max)}$: maximum power efficiency; $EQE_{(max)}$: external quantum efficiency; CIE (x, y): color coordinates.

Formula (I)

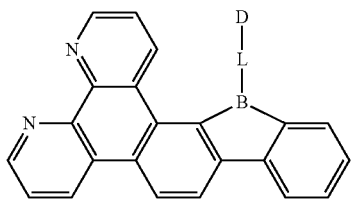

wherein

L is selected from the group consisting of a substituted or unsubstituted phenyl, a substituted or unsubstituted naphthyl, a substituted or unsubstituted pyridyl, a substituted or unsubstituted pyrimidinyl, and a substituted or unsubstituted pyrazinyl; and D is an electron donor, and is selected from the group consisting of a substituted or unsubstituted phenyl, a substituted or unsubstituted biphenyl, a substituted or unsubstituted naphthyl, a substituted or unsubstituted anthryl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted benzophenanthrenyl, a substituted or unsubstituted benzanthracenyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, a substituted or unsubstituted carbazolyl, a substituted or unsubstituted acridinyl, and a substituted or unsubstituted diarylamino.

2. The compound according to claim 1, wherein D is according to the following formulas:

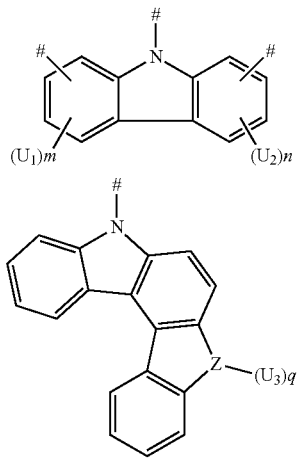

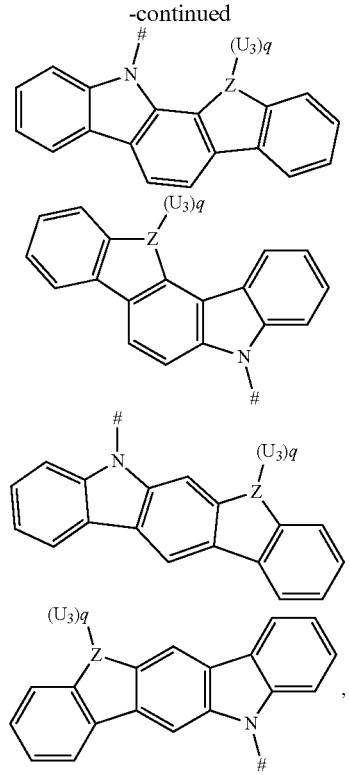

wherein Z is selected from the group consisting of a carbon atom, a nitrogen atom, an oxygen atom and a sulfur atom;

$U_1$, $U_2$ and $U_3$ are each independently selected from the group consisting of a hydrogen atom, C1-C6 alkyl, and C1-C6 alkoxy;

q is an integer selected from 0, 1 and 2;

when Z is an oxygen atom or a sulfur atom, q is 0; and indicates a bonding position.

3. The compound according to claim 2, wherein D is any one of the following groups:

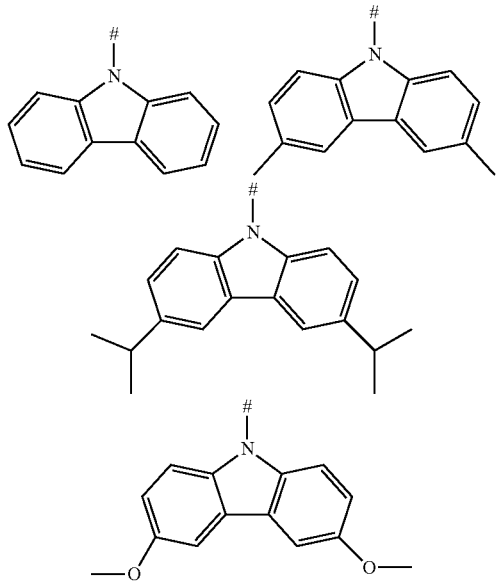

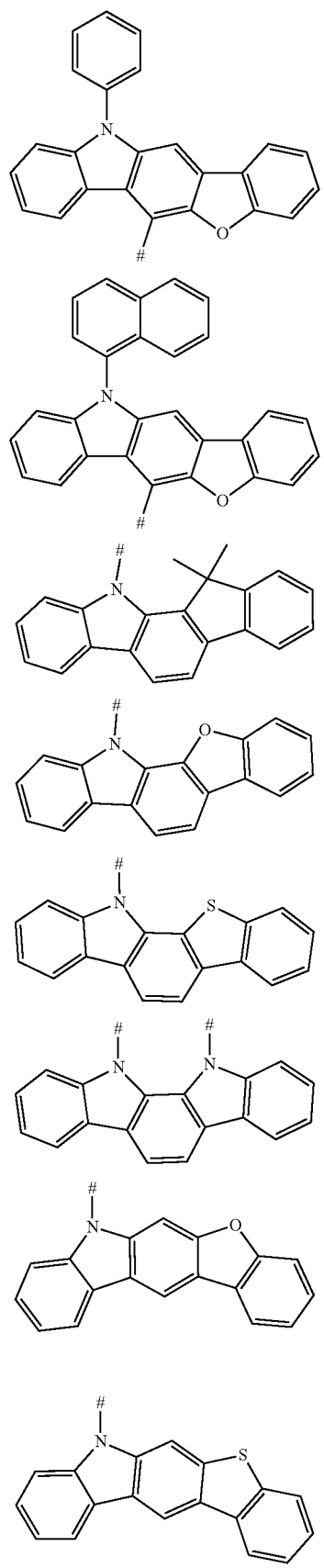
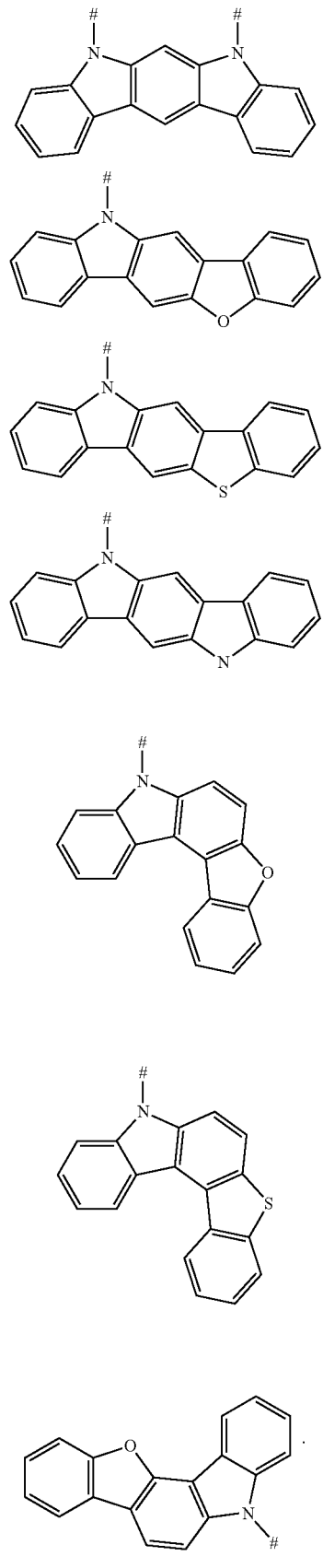

4. The compound according to claim 1, wherein D is according to the following formulas:

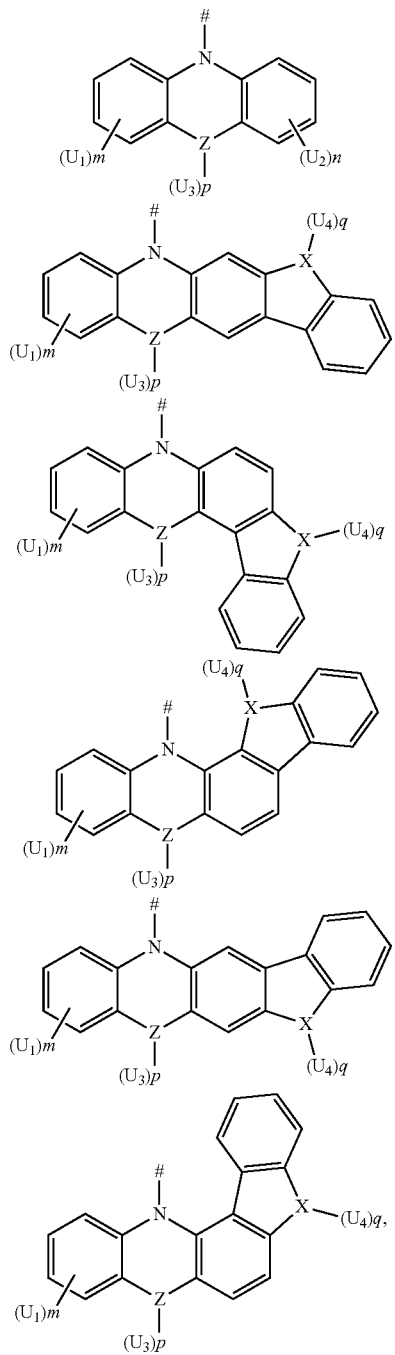

wherein
Z is selected from the group consisting of a carbon atom, a nitrogen atom, an oxygen atom, a sulfur atom and a silicon atom;
X is selected from the group consisting of a carbon atom, a nitrogen atom, an oxygen atom and a sulfur atom;
$U_1$, $U_2$, $U_3$ and $U_4$ are each independently selected from the group consisting of a hydrogen atom, C1-C6 alkyl, C3-C6 cycloalkyl, C1-C6 alkoxy, and C6-C12 aryl;
m, n, p and q are each an integer independently selected from 0, 1 and 2;
when Z is an oxygen atom or a sulfur atom, p is 0;
when X is an oxygen atom or a sulfur atom, q is 0; and
indicates a bonding position.

5. The compound according to claim 4, wherein D is according to any one of the following formulas:

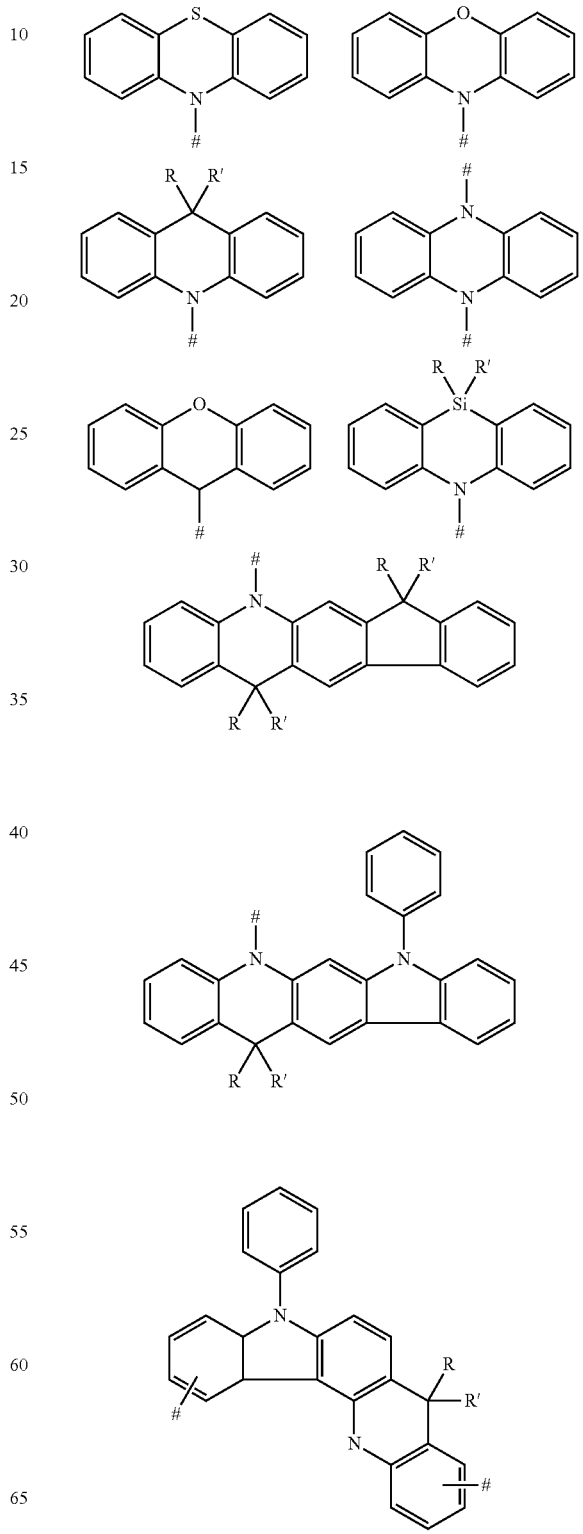

-continued

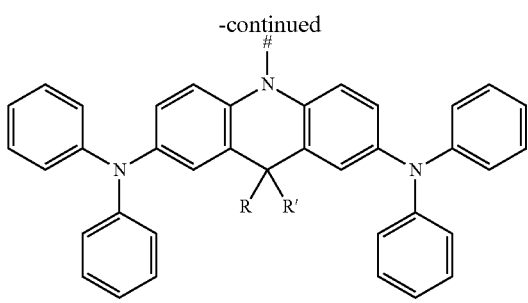

wherein,

R and R' are each independently selected from the group consisting of a hydrogen atom, C1-C3 alkyl, and phenyl, and indicates a bonding position.

6. The compound according to claim 1, wherein D is according to the following formula:

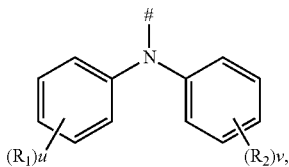

wherein $R_1$ and $R_2$ are each independently selected from the group consisting of a hydrogen atom, C1-C6 alkyl, and C1-C6 alkoxy;

u and v are each an integer independently selected from 0, 1, and 2; and indicates a bonding position.

7. The compound according to claim 6, wherein D is any one of the following groups:

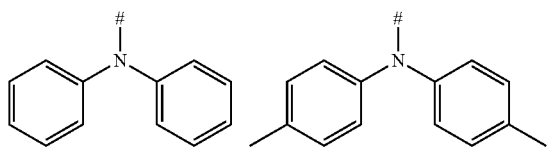

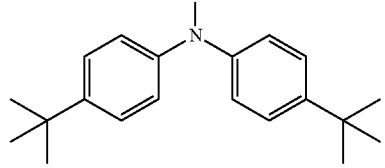

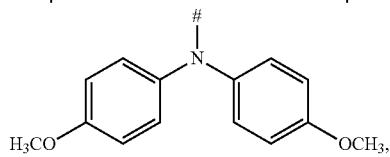

wherein # indicates a bonding position.

8. The compound according to claim 1, wherein D is any one of the following groups:

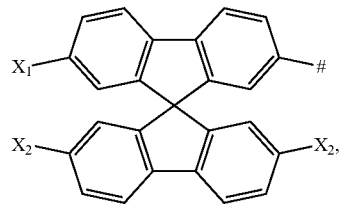

$X_1$, $X_2$ and $X_3$ are each independently selected from a hydrogen atom, C1-C6 alkyl, C1-C6 alkoxy, C6-C12 aryl, and oligothiophenyl, and indicates a bonding position.

9. The compound according to claim 8, wherein $X_1$, $X_2$ and $X_3$ are each oligothiophenyl.

10. The compound according to claim 1, wherein L is:

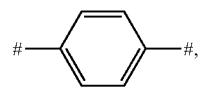

D is according to the following formula:

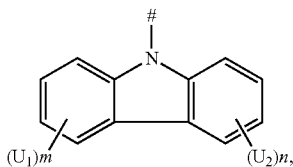

wherein $U_1$ and $U_2$ are each independently selected from C1-C3 alkyl;

m and n are each an integer independently selected from 0, 1 and 2, and indicates a bonding position.

11. The compound according to claim 1, wherein L is:

D is according to the following formula:

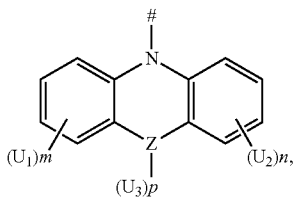

wherein Z is selected from the group consisting of a carbon atom, a nitrogen atom, an oxygen atom and a sulfur atom;

m and n are 0, and p is an integer selected from 0, 1 and 2;

$U_1$, $U_2$ and $U_3$ are each independently selected from the group consisting of C1-C3 alkyl and C6-C12 aryl;

when Z is an oxygen atom or a sulfur atom, p is 0; and
indicates a bonding position.

12. The compound according to claim 1, wherein
L is:

D is according to the following formula:

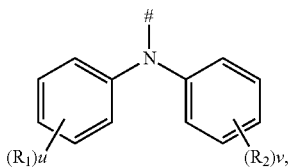

wherein $R_1$ and $R_2$ are each independently selected from the group consisting of C1-C3 alkyl;

u and v are each an integer independently selected from 0, 1 and 2, and indicates a bonding position.

13. The compound according to claim 1, wherein the compound is selected from the group consisting of:

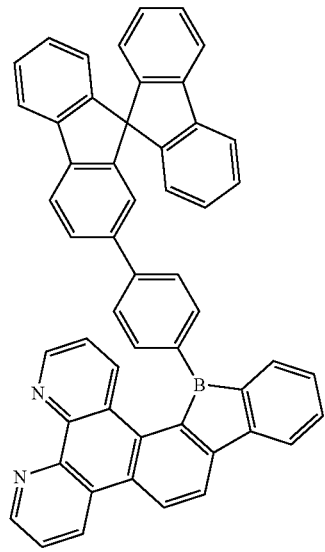

M1

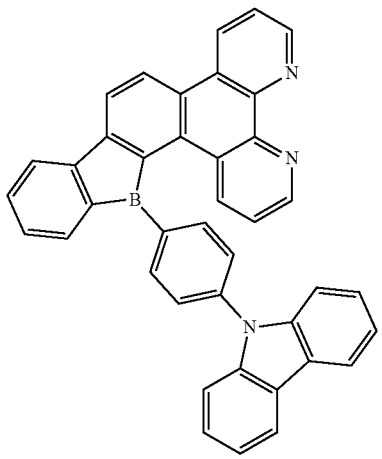

M2

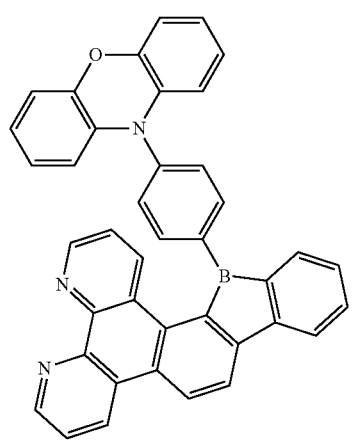

M3

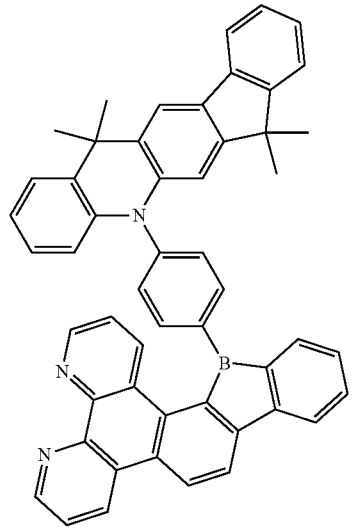

M4

M5
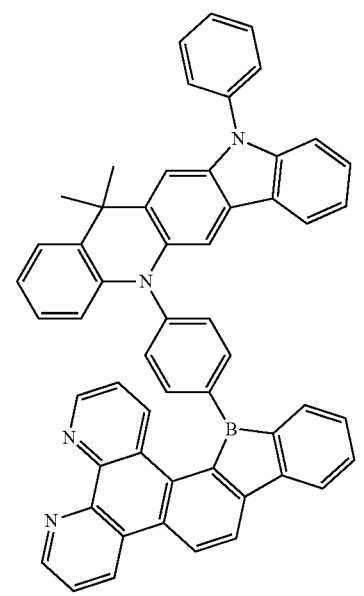
M6
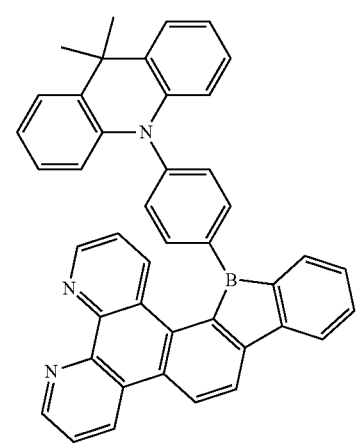
M7
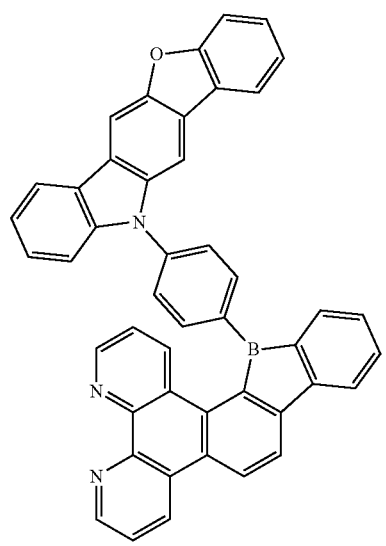
M8
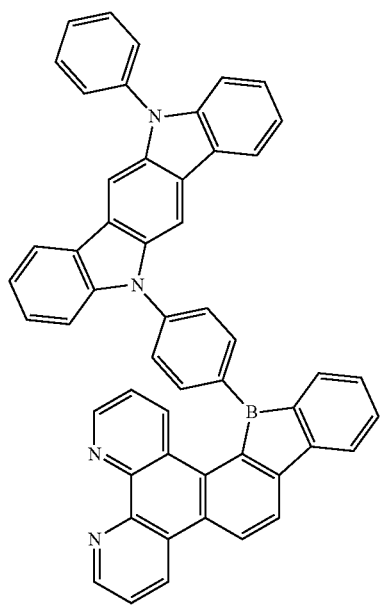
M9
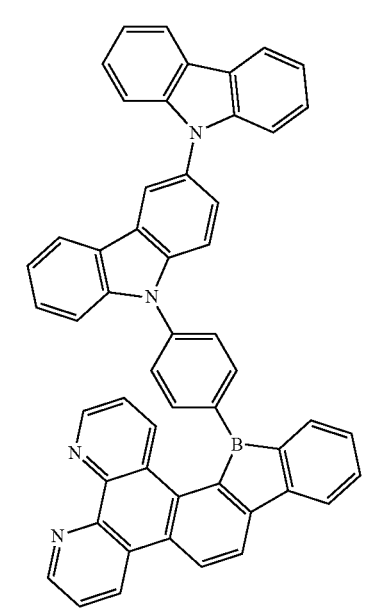
M10

M11
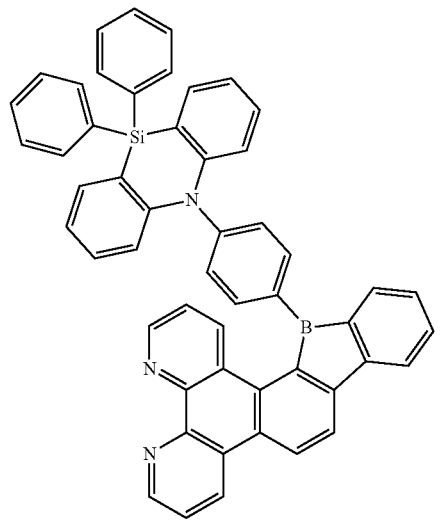
M12
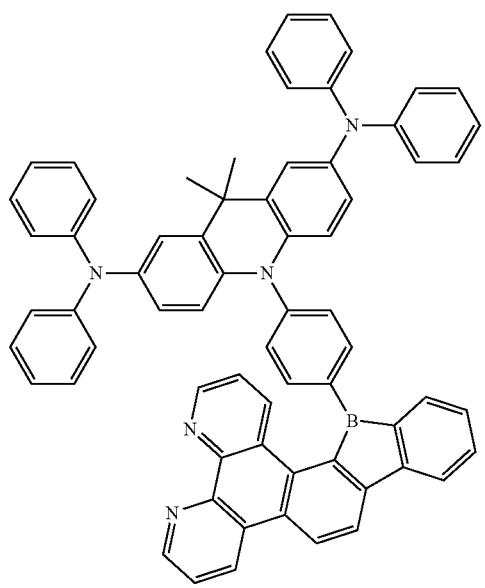
M13
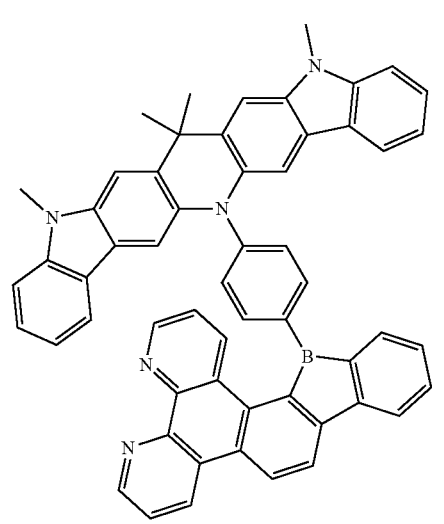
M14
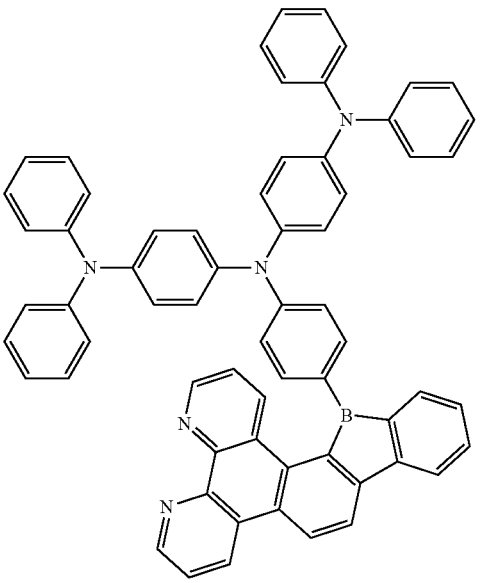
M15
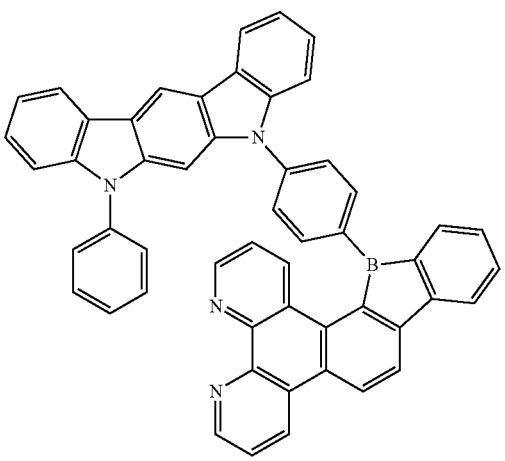
M16
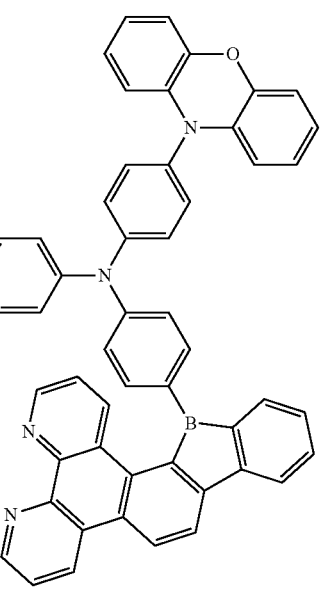

M17
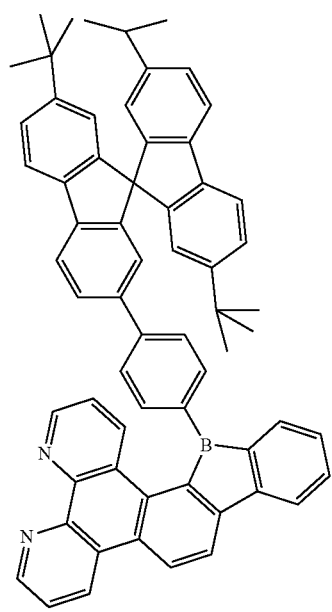
M18
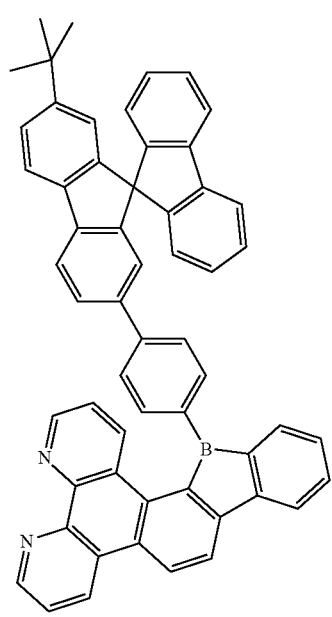
M19
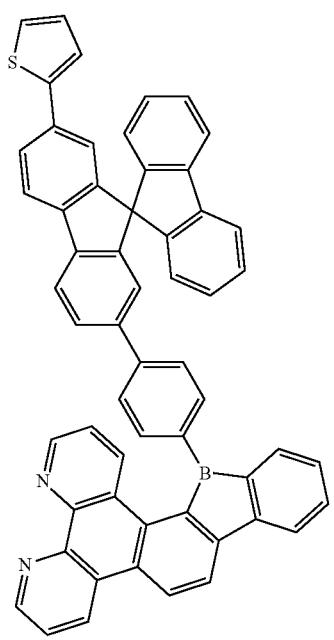
M20
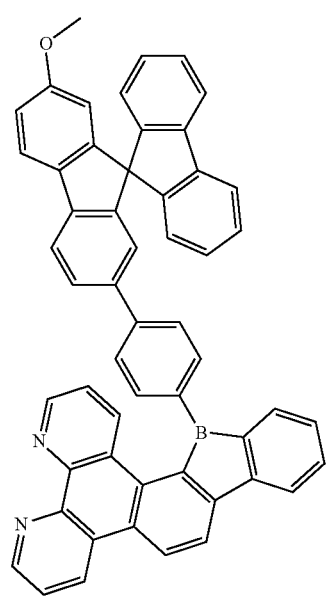
M21
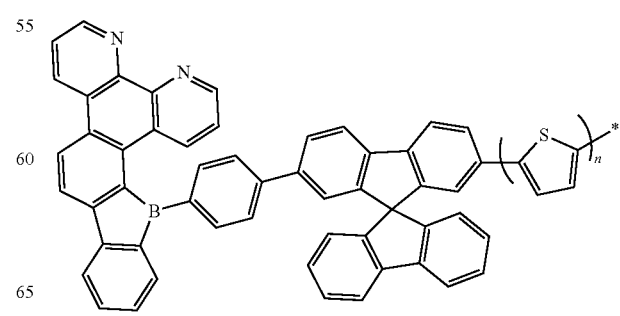

-continued

M22

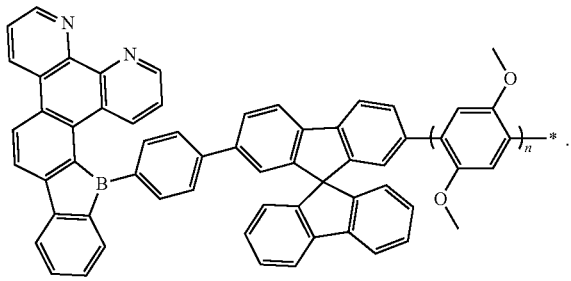

14. The compound according to claim 1, wherein an energy difference $\Delta E_{st}$ between a lowest singlet energy level, $E_{S1}$, of the compound and a lowest triplet energy level, $E_{T1}$, of the compound satisfies an equation $\Delta E_{st}=E_{S1}-E_{T1}\leq 0.20$ eV.

15. A display panel, comprising:
 an anode;
 a cathode; and
 a light-emitting layer disposed between the anode and the cathode,
 wherein a light-emitting material of the light-emitting layer comprises one or more compounds according to claim 1.

16. The display panel according to claim 15, wherein the light-emitting material of the light-emitting layer comprises a host material and a guest material, and the host material is one or more compounds according to claim 1.

17. A display apparatus, comprising the display panel according to claim 15.

* * * * *